United States Patent
Katti

(10) Patent No.: US 10,763,425 B1
(45) Date of Patent: Sep. 1, 2020

(54) MAGNETIC TUNNEL JUNCTION BASED PROGRAMMABLE MEMORY CELL

(71) Applicant: Honeywell International Inc., Morris Plains, NJ (US)

(72) Inventor: Romney R. Katti, Shorewood, MN (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 16/427,074

(22) Filed: May 30, 2019

(51) Int. Cl.
*G11C 11/16* (2006.01)
*H01L 43/02* (2006.01)

(52) U.S. Cl.
CPC ............ *H01L 43/02* (2013.01); *G11C 11/161* (2013.01); *G11C 11/1673* (2013.01); *G11C 11/1675* (2013.01)

(58) Field of Classification Search
CPC .......................... G11C 11/1675; G11C 11/161
USPC .................................................. 365/158, 173
See application file for complete search history.

(56) References Cited

U.S. PATENT DOCUMENTS

| | | | |
|---|---|---|---|
| 5,640,343 A | 6/1997 | Gallagher et al. | |
| 6,269,018 B1 | 7/2001 | Monsma et al. | |
| 6,347,049 B1 | 2/2002 | Childress et al. | |
| 6,385,082 B1 | 5/2002 | Abraham et al. | |
| 6,593,608 B1 | 7/2003 | Sharma et al. | |
| 6,747,891 B2 | 6/2004 | Hoffmann et al. | |
| 6,845,038 B1 | 1/2005 | Shukh | |
| 6,865,109 B2 | 3/2005 | Covington | |
| 7,245,527 B2 | 7/2007 | Qureshi et al. | |
| 7,411,814 B2 | 8/2008 | Lenssen | |
| 7,791,937 B2 | 9/2010 | Jedema et al. | |
| 7,825,445 B2 | 11/2010 | Covington | |
| 8,039,913 B2 | 10/2011 | Zheng et al. | |
| 8,772,051 B1 | 7/2014 | Zhong et al. | |
| 8,779,538 B2 | 7/2014 | Chen et al. | |
| 8,912,614 B2 | 12/2014 | Vetro et al. | |
| 9,293,698 B2 | 3/2016 | Whig et al. | |
| 9,437,655 B2 | 9/2016 | Hsueh et al. | |
| 2005/0117391 A1* | 6/2005 | Yoda ...................... | G11C 11/15 365/171 |
| 2008/0143382 A1* | 6/2008 | Bangert ................. | G11C 17/02 326/41 |
| 2010/0148167 A1 | 6/2010 | Whig et al. | |

(Continued)

OTHER PUBLICATIONS

Wang et al., "Low-current blocking temperature writing of double barrier magnetic random access memory cells," Applied Physics Letters, vol. 84, Issue 6, Feb. 4, 2004, 5 pp.

(Continued)

*Primary Examiner* — Michael T Tran
(74) *Attorney, Agent, or Firm* — Shumaker & Sieffert, P.A.

(57) ABSTRACT

An example device for performing a write operation, the device including a Magnetic Tunnel Junction (MTJ) element and processing circuitry. The MTJ element including a free structure, a pinned structure, and a tunnel barrier arranged between the free structure and the pinned structure. The processing circuitry is configured to receive an instruction to set the MTJ element to a low-resistance state and provide a write voltage to the MTJ element such that the tunnel barrier breaks down to generate a low-resistance channel between the free structure and the pinned structure.

18 Claims, 15 Drawing Sheets

(56) References Cited

U.S. PATENT DOCUMENTS

| | | | | |
|---|---|---|---|---|
| 2010/0328992 | A1* | 12/2010 | Kano | G11C 11/005 |
| | | | | 365/158 |
| 2012/0133050 | A1* | 5/2012 | Gaidis | H01L 23/5252 |
| | | | | 257/774 |
| 2014/0159770 | A1* | 6/2014 | Shukh | H03K 19/16 |
| | | | | 326/37 |
| 2015/0262701 | A1* | 9/2015 | Takizawa | G11C 11/1659 |
| | | | | 365/96 |
| 2016/0293268 | A1* | 10/2016 | Jan | G11C 11/1673 |
| 2017/0125071 | A1* | 5/2017 | Lee | G11C 11/161 |
| 2018/0033954 | A1* | 2/2018 | Aradhya | H01L 43/06 |
| 2018/0350498 | A1* | 12/2018 | Kazemi | H01F 10/329 |
| 2019/0207081 | A1* | 7/2019 | Sharma | H01L 27/228 |
| 2020/0043538 | A1* | 2/2020 | Mihajlovic | G11C 11/1657 |
| 2020/0126705 | A1* | 4/2020 | Levy | G11C 11/1675 |

OTHER PUBLICATIONS

Zhu et al., "Magnetic tunnel junctions," Science Direct, Materials Today, vol. 9, Issue 11, Nov. 2006, 22 pp.

"STT-MRAM: Introduction and market status," MRAM-info, The Graphene Handbook, accessed from https://www.mram-info.com/stt-mram, last updated Feb. 19, 2019, 7 pp.

\* cited by examiner

MAGNETIC TUNNEL JUNCTION BASED PROGRAMMABLE MEMORY CELL

TECHNICAL FIELD

This disclosure relates to memory devices and, more specifically, to Magnetic Tunnel Junction (MTJ) based programmable Read Only Memory (ROM).

BACKGROUND

Many modern electronic devices include a power source, components for storing data, components for processing data, components for receiving user input, and components for delivering user output. It is desirable for such electronic devices to have long battery life, powerful processing capabilities, and large amounts of data storage, but at the same time, it is also desirable for electronic devices to maintain small and lightweight form factors. To meet these conflicting demands, it is desirable for the components of these devices to become smaller with better performance.

It is generally desirable for memory components, for example, to store more data in a smaller space with faster read and write operations. Current types of non-volatile memory include electro-mechanical hard drives where read/write heads read and write data from and to a series of rotating disks. Other types of non-volatile memory include solid state memories that use transistors and other devices (e.g., capacitors, floating gate MOSFETs, etc.) to store data without any moving parts and with faster read and write access.

SUMMARY

This disclosure generally describes techniques for a Magnetic Tunnel Junction (MTJ) based programmable memory device to provide a programmable Read Only Memory (ROM).

In one example, a device for performing a write operation includes an MTJ element and processing circuitry. The MTJ element includes a free structure, a pinned structure, and a tunnel barrier arranged between the free structure and the pinned structure. The processing circuitry is configured to receive an instruction to set the MTJ element to a low-resistance state and provide a write voltage to the MTJ element such that the tunnel barrier breaks down to generate a low-resistance channel between the free structure and the pinned structure.

In another example, a method for performing a write operation includes receiving, by processing circuitry, an instruction to set the magnetic tunnel junction element to a low-resistance state, wherein the magnetic tunnel junction element includes a free structure, a pinned structure, and a tunnel barrier, the free structure being spaced apart from the pinned structure by the tunnel barrier and providing, by the processing circuitry, a write voltage to the magnetic tunnel junction element such that the tunnel barrier breaks down to generate a low-resistance channel between the free structure and the pinned structure.

In another example, a device for performing a write operation includes means for receiving an instruction to set the magnetic tunnel junction element to a low-resistance state, the magnetic tunnel junction element including a free structure, a pinned structure, and a tunnel barrier, the free structure being spaced apart from the pinned structure by the tunnel barrier and means for providing a write voltage to the magnetic tunnel junction element such that the tunnel barrier breaks down to generate a low-resistance channel between the free structure and the pinned structure.

The details of one or more aspects of the disclosure are set forth in the accompanying drawings and the description below. Other features, objects, and advantages of the devices, systems, methods, and techniques described in this disclosure will be apparent from the description and drawings, and from the claims.

DETAILED DESCRIPTION

Figure 1A:
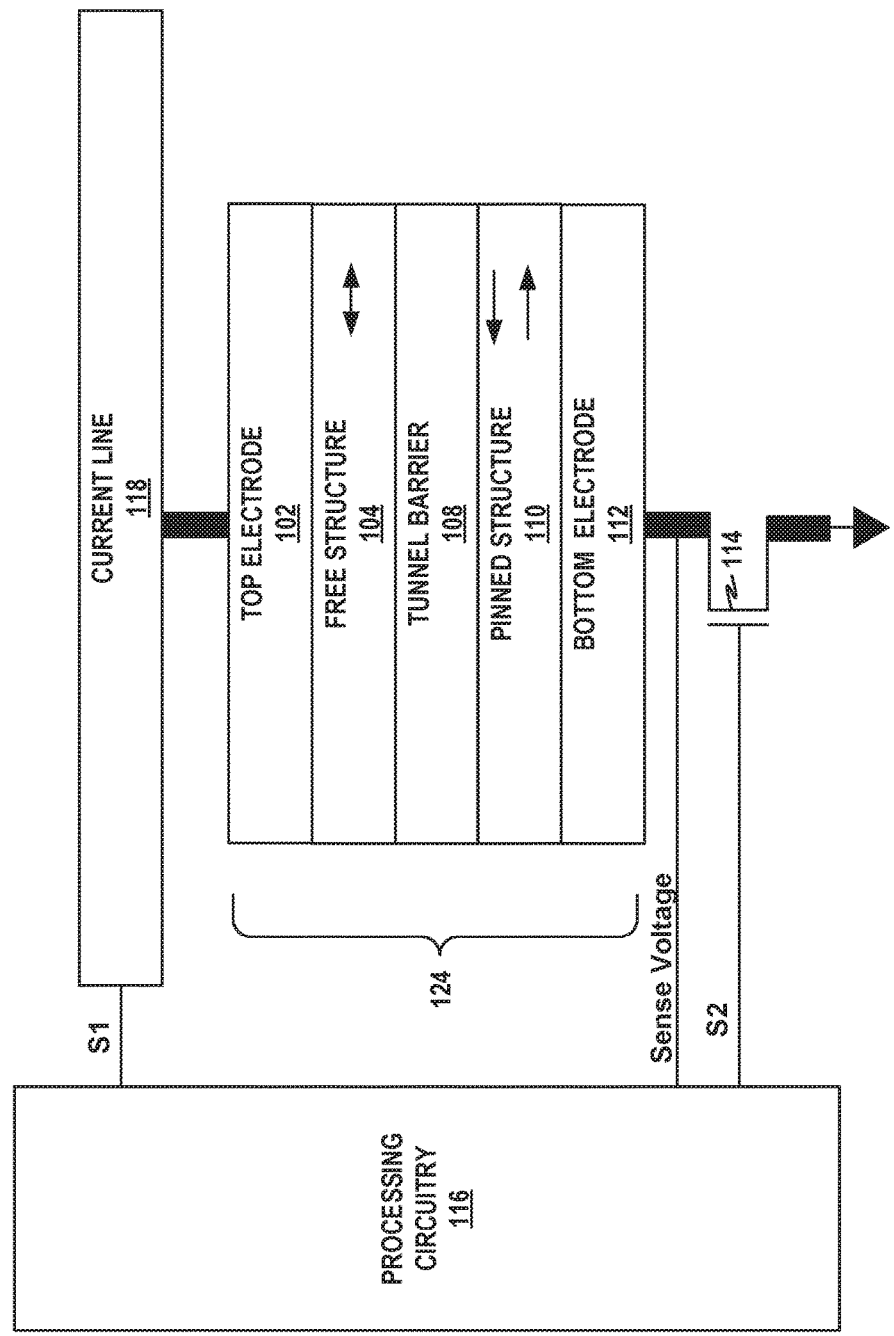
FIG. 1A shows a conceptual illustration of a first Magnetic Tunnel Junction (MTJ) based programmable Read Only Memory (ROM) device during a first state with a parallel orientation.

Some applications have been identified in which memory devices, memory components/parts, and architectures may need to be radiation-hardened, offer non-volatility, and/or include magnetically-based devices that can be integrated monolithically or in multi-chip modules. Magneto-Resistive Random Access Memory (MRAM) is robust, has high endurance, has high data retention performance, and is scalable. These characteristics can be tailored for applications. Magnetic/spintronic memory devices are expected to provide desired non-volatile (and volatile) memory and data storage characteristics; including providing scalability, high endurance, and high data retention performance. These characteristics can be optimized for applications. Magnetic/ spintronic memory devices may offer materials and technological similarity and compatibility with MRAM bits and other sensing devices such as accelerometers, gyros, and pressure sensors, which may support integration, modularity, miniaturization, and packaging with embedded MRAM and Application Specific Integrated Circuits (ASICs).

In accordance with one or more techniques described herein, processing circuitry may be constructed to include a memory device with a structure that uses a breakdown of a tunnel barrier of a Magnetic Tunnel Junction (MTJ) element tunnel to write to the MTJ element and uses the MTJ element (with Tunneling Magneto-Resistive (TMR) sensing, or alternatively, Giant Magneto-Resistive (GMR) sensing or Anisotropic Magneto-Resistive (AMR) sensing) structure for read-back. In some examples, techniques may irreversibly place an MTJ element in a low-resistance state. Techniques may be configured for a use of one or both of higher resistance states for binary or trinary storage. Techniques may apply multi-level-cell architectures. In some examples, the MTJ element may not include a switchable free layer.

For example, techniques described herein may permit a construction of an MRAM, junction, and/or MTJ-based memory. Processing circuitry may be configured to use programming to irreversibly place chosen devices in low-resistance states. Processing circuitry may be configured to use one or both of the higher resistance states for binary or trinary storage. Processing circuitry may be configured to employ multi-level-cell and multi-layer-cell architectures. A switchable free layer may be omitted for the MRAM, junction, and/or MTJ-based memory. Processing circuitry may be configured to use Anisotropic, Giant, and/or Tunneling Magneto-Resistive effects when using magnetic devices. Such magnetic memory devices, memory components/parts, and architectures may be radiation-hardened and/or include devices that can be integrated monolithically or in multi-chip modules For example, processing circuitry may apply a write voltage across a series combination of a first MTJ element and a first switching element to "burn-in" a tunnel barrier of the first MTJ, which may represent a logical '1' value at the first MTJ. In this example, the processing circuitry may refrain from applying the write voltage across a series combination of a second MTJ element and a second switching element, which may represent a logical '0' value at the second MTJ. In way, processing circuitry may write to a set of MTJ elements.

To read the set of MTJ elements, the processing circuitry may apply a read voltage across the series combination of an MTJ element and a switching element (e.g., a select transistor). For example, the processing circuitry may determine that the MTJ element stores a logical '1' value in response the voltage across the switching element being greater than a read voltage threshold and may determine that the MTJ element stores a logical '0' value in response the voltage across the switching element being not greater than the read voltage threshold.

In some examples, an MTJ element may be set to more than two states. For example, processing circuitry may apply a first write voltage across a series combination of a first MTJ element and a first switching element to burn-in a first tunnel barrier and a second tunnel barrier of the first MTJ, which may represent a logical '10' value at the first MTJ. In this example, processing circuitry may apply a second write voltage across a series combination of a second MTJ element and a second switching element to burn-in only a first tunnel barrier of the second MTJ, which may represent a logical '01' value at the second MTJ. In this example, the processing circuitry may refrain from applying the first write voltage or the second write voltage across a series combination of a third MTJ element and a third switching element, which may represent a logical '00' value at the third MTJ.

To read the set of MTJ elements, the processing circuitry may apply a read voltage across each series combination of an MTJ element and a switching element (e.g., a select transistor). For example, the processing circuitry may determine that the MTJ element stores a logical '10' value in response the voltage across the switching element being higher than a first read voltage threshold, determine that the MTJ element stores a logical '01' value in response the voltage across the switching element being less than the first read voltage threshold and greater than a second read voltage threshold, and determine that the MTJ element stores a logical '00' value in response the voltage across the switching element being less than the first read voltage threshold and less than the second read voltage threshold.

Such magnetic memory devices may provide unique and desired application functionality, customization prospects, and environmental capability for various environments. Such magnetic memory devices may offer materials and technological similarity and compatibility with sensing devices such as accelerometers, gyros, and pressure sensors, which may support integration, modularity, miniaturization, and packaging with embedded MRAM and ASICS. In some examples, such magnetic memory device described herein may be used for die-to-die or monolithic integration with MTJ elements and/or MTJ element die.

FIG. 1A shows a conceptual illustration of a first MTJ based programmable ROM device 100 during a first state with a parallel orientation. Device 100 may represent a non-volatile memory. For instance, device 100 may remain in a state (e.g., low-resistance, high-resistance, etc.) when device 100 is unpowered. In some examples, device 100 may represent a Programable ROM (PROM). For example, writing to set device 100 to a low-resistance state may be irreversible. Device 100 includes current line 118, top electrode 102, free structure 104, tunnel barrier 108, pinned structure 110, bottom electrode 112, switching element 114, and processing circuitry 116. A shape of components of device 100 may be varied to address and to optimize for performance. Materials of components of device 100 may be varied to address and to optimize for performance. Current line 118 may be formed of an electrically conductive material. Examples of electrically conductive materials may include, but are not limited to, for example, copper, or other electrically conductive materials.

MTJ element 124 includes top electrode 102, free structure 104, tunnel barrier 108, pinned structure 110, and bottom electrode 112. In some examples, MTJ element 124 may include free structure 104, tunnel barrier 108, pinned structure 110 and omit one or more of top electrode 102 and bottom electrode 112. Top electrode 102 and/or bottom electrode 112 may be formed of an electrically conductive material. Free structure 104 may include a magnetization direction that is free to switch between a parallel orientation and an antiparallel orientation. Although the example of FIG. 1 illustrates a free structure, in some examples, free structure 104 may be omitted. For example, free structure 104 may be replaced by a pinned structure or metal layer. Tunnel barrier 108 includes a non-magnetic metal that separates free structure 104 and pinned structure 110. In some examples, a voltage drop across MTJ element 124 is primarily across tunnel barrier 108. For example, tunnel barrier 108 may represent more than 80%, more than 90%, etc. of the total resistance of MTJ element 124. In some examples, tunnel barrier 108 may be formed of aluminum oxide, magnesium oxide, or another material.

Pinned structure 110 may include a magnetization direction that is fixed or "pinned" to a single orientation. For example, pinned structure 110 may be pinned in a parallel orientation. In other examples, pinned structure 110 may be pinned in an antiparallel orientation. In the example of FIG. 1, pinned structure 110 may include an anti-ferromagnetic layer, such that the magnetization direction of the pinned structure 110 is "pinned" in a particular orientation the magnetization direction of the pinned structure 110 remains relatively fixed when operational magnetic fields are applied to MTJ element 124.

Switching element 114 may be configured to operate in a first state (e.g., switched-in) that generates an electrical channel coupling bottom electrode 112 to a node (e.g., a reference node, ground, etc.) of processing circuitry 116 and in a second state (e.g., switched-out) that refrains from generating the electrical channel coupling bottom electrode 112 to processing circuitry 116. Examples of switching element 114 may include, but are not limited to, a silicon-controlled rectifier (SCR), a Field Effect Transistor (FET), and a bipolar junction transistor (BJT).

Examples of FETs may include, but are not limited to, a junction field-effect transistor (JFET), a metal-oxide-semiconductor FET (MOSFET), a dual-gate MOSFET, an insulated-gate bipolar transistor (IGBT), any other type of FET, or any combination of the same. Examples of MOSFETS may include, but are not limited to, a depletion mode p-channel MOSFET (PMOS), an enhancement mode PMOS, depletion mode n-channel MOSFET (NMOS), an enhancement mode NMOS, a double-diffused MOSFET (DMOS), any other type of MOSFET, or any combination of the same.

Examples of BJTs may include, but are not limited to, PNP, NPN, heterojunction, or any other type of BJT, or any combination of the same. It should be understood that switching elements may be high-side or low-side switching elements. Additionally, switching elements may be voltage-controlled and/or current-controlled. Examples of current-controlled switching elements may include, but are not limited to, gallium nitride (GaN) MOSFETs, BJTs, or other current-controlled elements.

Processing circuitry 116 may include metallization and/or integrated circuitry (e.g., Complementary metal-oxide-semiconductor (CMOS)). Processing circuitry 116 may include an analog circuit. In some examples, processing circuitry 116 may include a microcontroller on a single integrated circuit containing a processor core, memory, inputs, and outputs. For example, processing circuitry 116 may include one or more processors, including one or more microprocessors, Digital Signal Processors (DSPs), ASICS, Field Programmable Gate Arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. In some examples, processing circuitry 116 include a combination of one or more analog components and one or more digital components.

Processing circuitry 116 may be configured to receive an instruction to set MTJ element 124 to a low-resistance state. For example, processing circuitry 116 may receive an instruction to set MTJ element 124 to a logical state (e.g., '0', '00'. etc.). As used herein, a low-resistance state may refer to a state of MTJ element 124 after programming. In some examples, the low-resistance state is permanent and/or MTJ element 124 may not change from the low-resistance state to a higher resistance state.

Processing circuitry 116 may provide a write voltage to MTJ element 124 such that tunnel barrier 108 breaks down to generate a low-resistance channel between free structure 104 and pinned structure 110. For example, processing circuitry 116 may apply a voltage at current line 118 that causes a dielectric structure of tunnel barrier 108 to breakdown (see FIG. 1C.)

Processing circuitry 116 may determine a state of MTJ element 124 based on whether tunnel barrier 108 has been burned-in. For example, processing circuitry 116 may determine a state of MTJ element 124 is the low-resistance state in response to determining the resistance at MTJ element 124 is less than a threshold resistance. In this example, processing circuitry 116 may determine the state of MTJ element 124 is not the low-resistance state in response to determining the resistance at MTJ element 124 is not less than a threshold resistance.

For example, processing circuitry 116 may apply a read voltage at current line 118 and measure a resulting voltage (e.g., a sense voltage) across switching element 114. For instance, processing circuitry 116 may apply a read voltage across the series string formed by MTJ element 124 and switching element 114. Processing circuitry 116 may detect a sense voltage across switching element 114 while applying the read voltage across the series string formed by MTJ element 124 and switching element 114. In this instance, processing circuitry 116 may determine the resistance at MTJ element 124 is less than the threshold resistance in response to the sense voltage being greater than a voltage threshold and determine the resistance at MTJ element 124 is not less than the threshold resistance in response to the sense voltage being not greater than the voltage threshold.

A magnetization direction of free structure 104 may indicate different states of MTJ element 124. For example, processing circuitry 116 may detect a difference in a magneto-resistance at MTJ element 124 resulting from a magnetization direction (e.g., parallel orientation or anti-parallel orientation) of free structure 104 relative to pinned structure 110 to determine a state (e.g., logical '1' or logical '0') of MTJ element 124. In some examples, MTJ element 124 may comprise a magnetization direction when MTJ element 124 is in a high-resistance state (e.g., not a low-resistance state). A parallel state of MTJ element 124 may include instances when free structure 104 has a magnetization direction that is in parallel with pinned structure 110. In the example of FIG. 1A, MTJ element 124 may be set in the parallel state when free structure 104 has a horizontal magnetization direction and pinned structure 110 has a horizontal magnetization direction. In some instances, MTJ element 124 may be set in the parallel state when free structure 104 has a vertical magnetization direction and pinned structure 110 has a vertical magnetization direction.

Processing circuitry 116 may perform a read operation on MTJ element 124 based on a resistance at MTJ element 124 and output a result of the read operation. For example, processing circuitry 116 may read a state of MTJ element 124 using a magneto-resistance of MTJ element 124. For example, processing circuitry 116 may determine a state of MTJ element 124 is a parallel magnetization state in response to determining the resistance at MTJ element 124 is less than a threshold resistance. In this example, processing circuitry 116 may determine the state of MTJ element 124 is an anti-parallel magnetization state in response to determining the resistance at MTJ element 124 is not less than the threshold resistance.

For example, to detect a magneto-resistance of MTJ element 124, processing circuitry 116 may apply a read voltage to current line 118 and detect a sense voltage at bottom electrode 112. For instance, processing circuitry 116 may read a higher voltage when MTJ element 124 is programmed in the parallel state (e.g., free structure 104 has a parallel orientation with pinned structure 110) compared to when MTJ element 124 is programmed in the anti-parallel state (e.g., free structure 104 has an anti-parallel orientation with pinned structure 110).

In this way, device 100 may represent a MRAM PROM that has a large change in resistance between a low-resistance state (e.g., 10 kΩ or less) and a high-resistance state (e.g., >100 kΩ). As such, device 100 may generate a large, robust, and reliable read signal compared to other PROMs as well as a fast read time. Moreover, as a size of device 100 decreases, the difference in resistance between the low-resistance state and the high-resistance state increases, thereby further improving a resulting read signal output by device 100. In some examples, device 100 may have a low current operation. Although not shown, in some examples, device 100 may include voltage protection circuitry and/or dose rate circuitry.

Figure 1B:
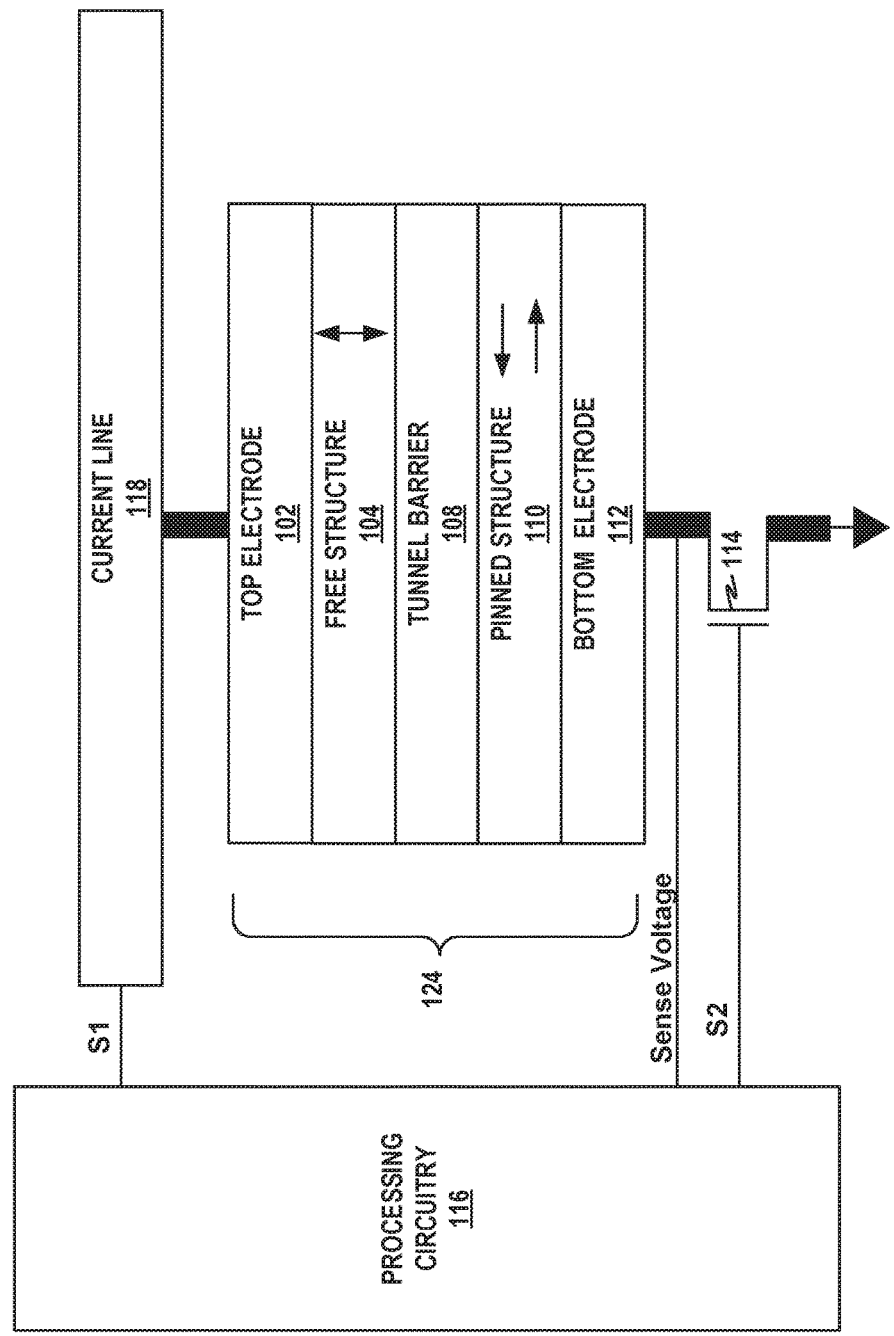
FIG. 1B shows a conceptual illustration of the first MTJ based programmable ROM device of FIG. 1A during a first state with anti-parallel orientation.

FIG. 1B shows a conceptual illustration of the first MTJ based programmable ROM device 100 of FIG. 1A during a first state with anti-parallel orientation. An anti-parallel orientation state of MTJ element 124 may include instances when free structure 104 has a magnetization direction that is anti-parallel with pinned structure 110. In the example of FIG. 1B, MTJ element 124 may be set in the anti-parallel orientation state when tunnel barrier 108 has not been blown (e.g., processing circuitry 116 has not applied a write voltage to MTJ element 124), free structure 104 has a vertical magnetization direction and pinned structure 110 has a horizontal magnetization direction. In some instances, MTJ element 124 may be set in the anti-parallel orientation state when free structure 104 has a horizontal magnetization direction and pinned structure 110 has a vertical magnetization direction.

In the example of FIG. 1B, processing circuitry 116 may detect a resulting voltage (e.g., a sense voltage) across switching element 114 that is small (e.g., less than a threshold) compared to when MTJ element 124 has been burned-in. For example, processing circuitry 116 may read a state of MTJ element 124 using a resistance of MTJ element 124. Moreover, processing circuitry 116 may detect a resulting voltage (e.g., a sense voltage) across switching element 114 that is greater than a voltage at MTJ element 124 when MTJ element 124 is set in the anti-parallel orientation state. In this way, processing circuitry 116 may read a state of MTJ element 124 and a magnetization direction using a resistance of MTJ element 124.

Figure 1C:
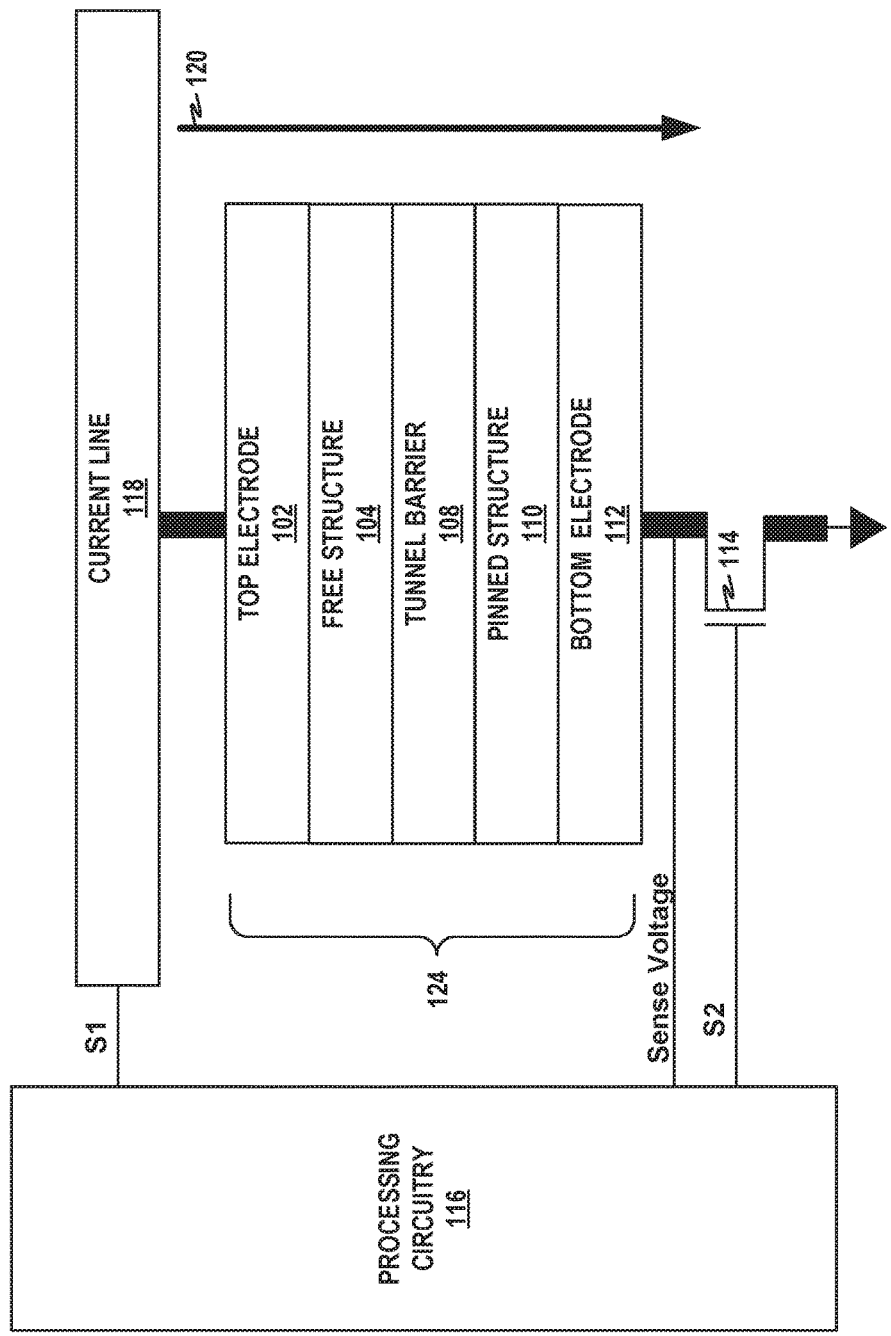
FIG. 1C shows a conceptual illustration of writing to the first MTJ based programmable ROM device of FIG. 1A.

FIG. 1C shows a conceptual illustration of writing to the first MTJ based programmable ROM device of FIG. 1A. In the example of FIG. 1C, processing circuitry 116 may write to MTJ element 124 by using an electrical current 120 to burn-in tunnel barrier 108. For instance, processing circuitry 116 may apply a write voltage at current line 118 that causes a dielectric structure of tunnel barrier 108 to breakdown, which may cause tunnel barrier 108 to function as a metal layer instead of a tunnel barrier. For example, processing circuitry 116 may burn-in tunnel barrier 108 such that a magnetization direction of pinned structure 110 sets the magnetization direction of free structure 104. In some examples, in response to a burn-in, tunnel barrier 108 may couple free structure 104 and pinned structure 110 with a lower electrical resistance compared to the electrical resistance of tunnel barrier 108 prior to burn-in.

Figure 1D:
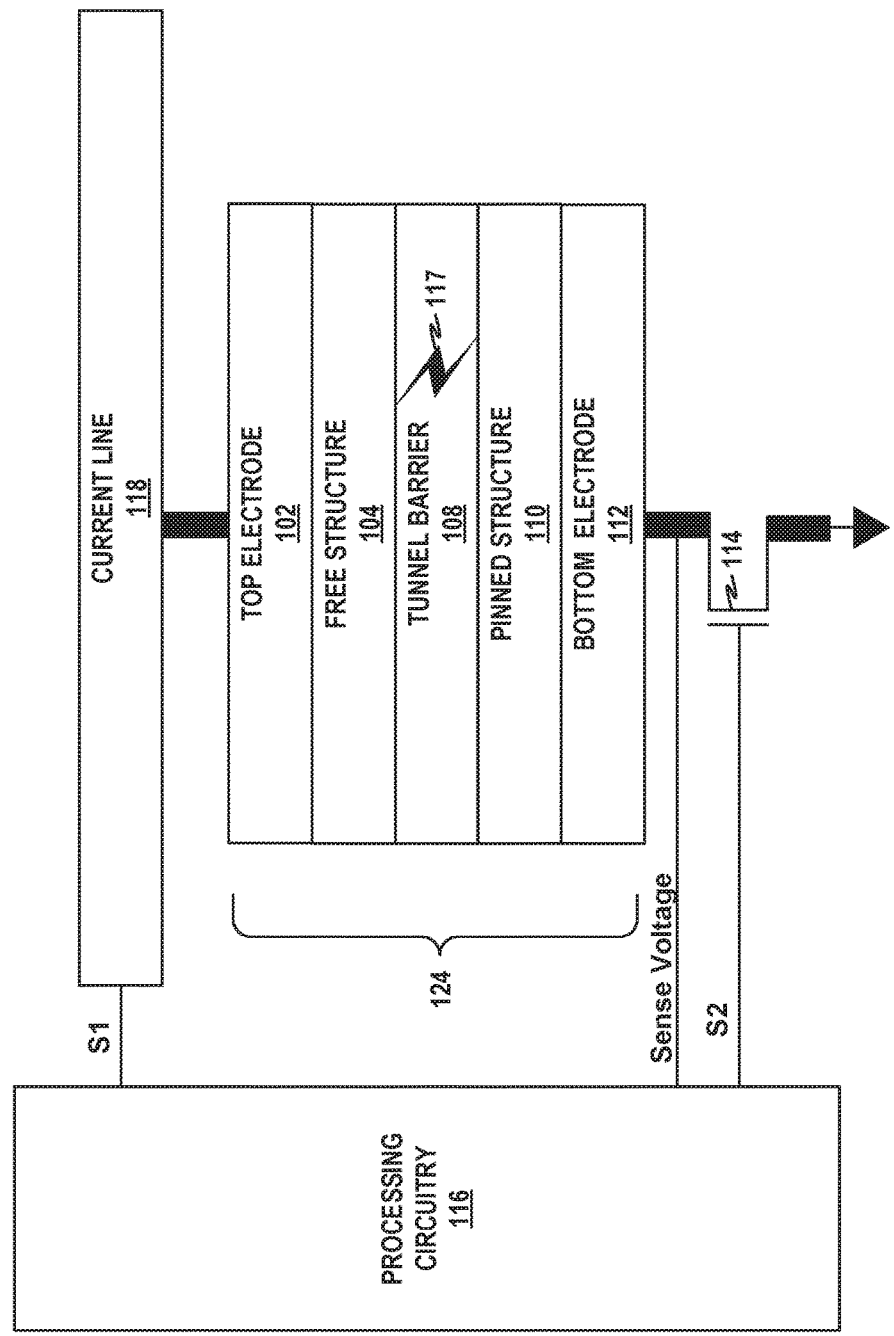
FIG. 1D shows a conceptual illustration of the first MTJ based programmable ROM device of FIG. 1A during a second state.

FIG. 1D shows a conceptual illustration of the first MTJ based programmable ROM device of FIG. 1A during a second state. In the example of FIG. 1D, electrical current 120 of FIG. 1C generated low-resistance channel 117 through tunnel barrier 108 that results in tunnel barrier 108 having a lower resistance than after applying electrical current 120 compared to a resistance of tunnel barrier 108 before applying electrical current 120. In some examples, low-resistance channel 117 may electrically connect free structure 104 and pinned structure 110 such that MTJ element 124 comprises a resistance of less than one-tenth of a resistance at MTJ element 124 before providing a write voltage (e.g., electrical current 120) to MTJ element 124. For example, MTJ element 124 may have a resistance of greater than 100 kΩ before providing a write voltage (e.g., electrical current 120) to MTJ element 124 and a resistance of 10 kΩ or less after providing the write voltage (e.g., electrical current 120) to MTJ element 124.

In response to providing a write voltage (e.g., electrical current 120) to MTJ element 124, low-resistance channel 117 may cause pinned structure 110 to set a magnetic field of free structure 104 to a horizontal magnetic direction or vertical magnetic field of pinned structure 110. For example, low-resistance channel 117 may cause pinned structure 110 to set a magnetic field of free structure 104 to a horizontal magnetic direction when pinned structure 110 comprises a horizontal magnetic direction. In some examples, low-resistance channel 117 may cause pinned structure 110 to set a magnetic field of free structure 104 to a vertical magnetic direction when pinned structure 110 comprises a vertical magnetic direction.

When MTJ element 124 has been burned-in, processing circuitry 116 may detect a resulting voltage (e.g., a sense voltage) across switching element 114 that is large (e.g., greater than a threshold) compared to when MTJ element 124 has not been burned-in. In contrast, when MTJ element 124 has not been burned-in (see FIGS. 1A, 1B), processing circuitry 116 may detect a resulting voltage (e.g., a sense voltage) across switching element 114 that is small (e.g., less than a threshold) compared to when MTJ element 124 has been burned-in. In this way, processing circuitry 116 may determine whether a state of MTJ element 124 corresponds to a first state where tunnel barrier 108 has not been burned-in or a second state (e.g., a low-resistance state) where tunnel barrier 108 has been burned-in.

Figure 2A:
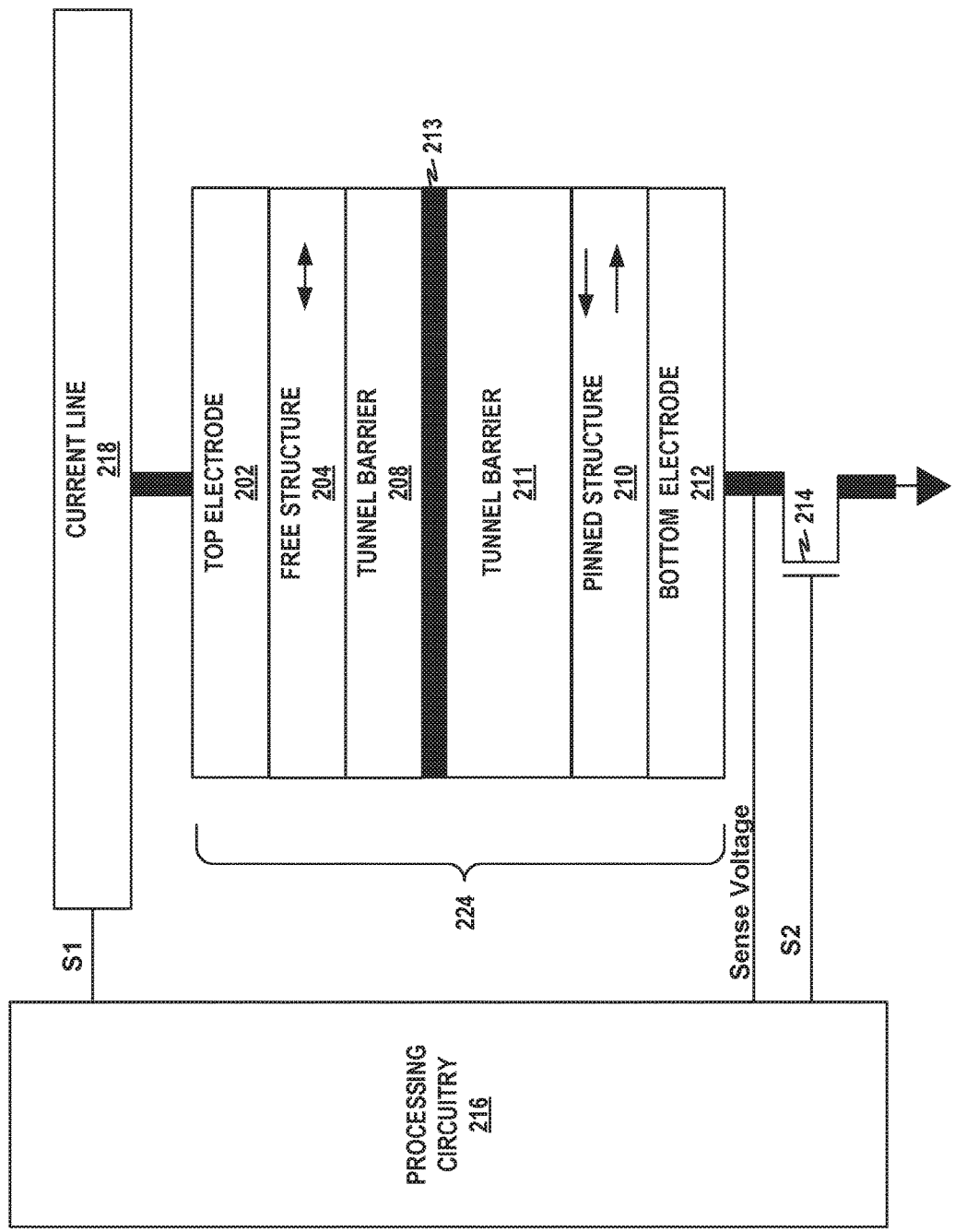
FIG. 2A shows a conceptual illustration of a second MTJ based programmable ROM device during a first state with a parallel orientation.

FIG. 2A shows a conceptual illustration of a second MTJ based programmable ROM device 200 during a first state with a parallel orientation. Device 200 may represent a non-volatile memory. For instance, device 200 may remain in a state (e.g., low-resistance, high-resistance, etc.) when device 200 is unpowered. In some examples, device 200 may represent a PROM. For example, writing to set device 200 to a low-resistance state may be irreversible. Device 200 includes current line 218, top electrode 202, free structure 204, tunnel barrier 208, pinned structure 210, bottom electrode 212, switching element 214, and processing circuitry 216, which may be examples of current line 118, top electrode 102, free structure 104, tunnel barrier 108, pinned structure 110, bottom electrode 112, switching element 114, and processing circuitry 116 of FIG. 1, respectively.

In the example of FIG. 2A, MTJ element 224 may include top electrode 202, free structure 204, tunnel barrier 208, pinned structure 210, and bottom electrode 212. In some examples, MTJ element 224 may include free structure 204, tunnel barrier 208, pinned structure 210 and omit one or more of top electrode 202 and bottom electrode 212. In this example, MTJ element 224 may further include metal layer 213 and tunnel barrier 211. Metal layer may include, for example, one or more of aluminum (Al), copper (Cu), Nickel (Ni), iron (Fe), Nickel iron (e.g., FeNi, NiFe, etc.), Cobalt (Co), Cobalt iron (e.g., CoFe, FeCo, etc.) or another material. Although the example of FIG. 2 illustrates a free structure, in some examples, free structure 204 may be omitted. For example, free structure 204 may be replaced by a pinned structure or metal layer.

Tunnel barrier 211 may be similar to tunnel barrier 208. For example, tunnel barrier 211 may be formed of, for example, a non-magnetic metal that separates metal layer 213 and pined structure 210. In some examples, tunnel barrier 211 may be formed of aluminum oxide, magnesium oxide, or another material. In the example of FIG. 2A, metal layer 213 spaces apart tunnel barrier 208 and tunnel barrier 211. In this example, tunnel barrier 211 spaces apart pinned structure 210 and free structure 204. As shown, tunnel barrier 208 spaces apart free structure 204 and metal layer 213. Tunnel barrier 211 spaces apart pinned structure 210 and metal layer 213. As shown, tunnel barrier 208 comprises a thickness less than a thickness of tunnel barrier 211. However, in other examples, tunnel barrier 211 comprises a thickness less than a thickness of tunnel barrier 208.

Processing circuitry 216 may determine a state of MTJ element 224 based on whether tunnel barrier 208 has been burned-in and based on whether tunnel barrier 211 has been burned-in. For example, processing circuitry 216 may apply a read voltage at current line 218 and measure a resulting voltage (e.g., a sense voltage) across switching element 214. In the example of FIG. 2A, processing circuitry 216 may detect a resulting voltage (e.g., a sense voltage) across switching element 214 that is small (e.g., less than a threshold) compared to when tunnel barrier 208 and/or tunnel barrier 211 has been burned-in.

A magnetization direction of free structure 204 may indicate different states of MTJ element 224. For example, processing circuitry 216 may use a magnetization direction (e.g., parallel orientation or anti-parallel orientation) of free structure 204 relative to pinned structure 210 to determine a state (e.g., logical '1' or logical '0') of MTJ 224. A parallel state of MTJ element 224 may include instances when free structure 204 has a magnetization direction that is in parallel with pinned structure 210. In the example of FIG. 2A, MTJ element 224 may be set in the parallel state when tunnel barrier 208 and tunnel barrier 211 have not been blown, free structure 204 has a horizontal magnetization direction and pinned structure 210 has a horizontal magnetization direction. In some instances, MTJ element 224 may be set in the parallel state when free structure 204 has a vertical magnetization direction and pinned structure 210 has a vertical magnetization direction.

For example, processing circuitry 216 may read a state of MTJ element 224 using a magneto-resistance of MTJ element 224. For instance, to detect a magneto-resistance of MTJ element 224, processing circuitry 216 may apply a read voltage to current line 218 and detect a sense voltage at bottom electrode 212. For instance, processing circuitry 216 may read a higher voltage when MTJ element 224 is programmed in the parallel state (e.g., free structure 204 has a parallel orientation with pinned structure 210) compared to when MTJ element 224 is programmed in the anti-parallel state (e.g., free structure 204 has an anti-parallel orientation with pinned structure 210).

MTJ element 224 may be set in an anti-parallel state when tunnel barrier 208 and tunnel barrier 211 have not been blown, free structure 204 has a horizontal magnetization direction and pinned structure 210 has a horizontal magnetization direction. In some instances, MTJ element 224 may be set in the parallel state when free structure 204 has a vertical magnetization direction and pinned structure 210 has a vertical magnetization direction.

For example, processing circuitry 116 may read a state of MTJ element 224 using a magneto-resistance of MTJ element 224. For instance, to detect a magneto-resistance of MTJ element 224, processing circuitry 216 may apply a read voltage to current line 218 and detect a sense voltage at bottom electrode 212. For instance, processing circuitry 216 may read a higher voltage when MTJ element 224 is programmed in the parallel state (e.g., free structure 204 has a parallel orientation) compared to when MTJ element 224 is programmed in the anti-parallel state (e.g., free structure 204 has an anti-parallel orientation).

Figure 2B:
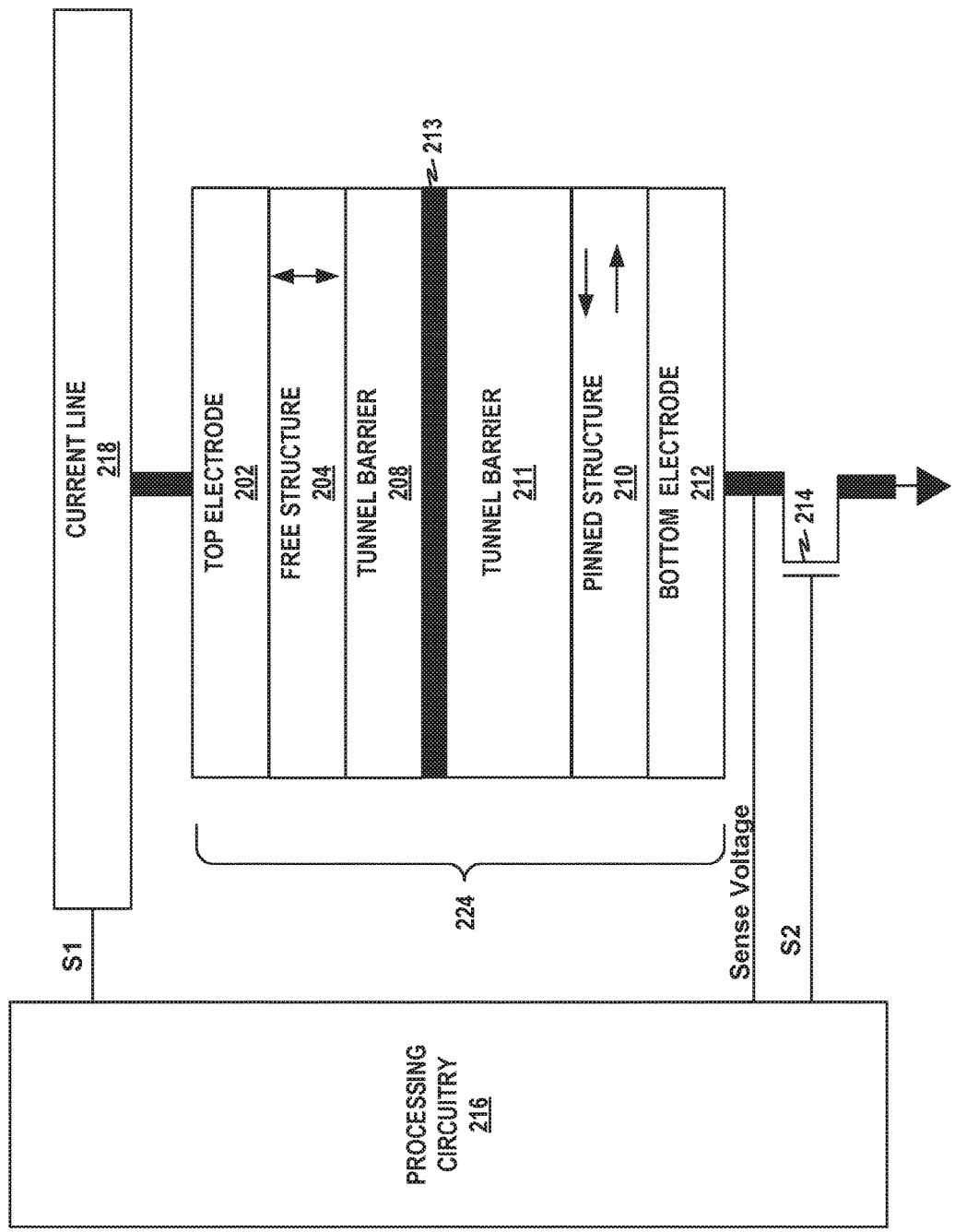
FIG. 2B shows a conceptual illustration of the second MTJ based programmable ROM device of FIG. 2A during a first state with anti-parallel orientation.

FIG. 2B shows a conceptual illustration of the second MTJ based programmable ROM device of FIG. 2A during a first state with anti-parallel orientation. An anti-parallel orientation state of MTJ element 224 may include instances when free structure 204 has a magnetization direction that is anti-parallel with pinned structure 210. In the example of FIG. 2B, MTJ element 224 may be set in the anti-parallel orientation state when tunnel barrier 208 and tunnel barrier 211 have not been blown, free structure 204 has a vertical magnetization direction and pinned structure 210 has a horizontal magnetization direction. In some instances, MTJ element 224 may be set in the anti-parallel orientation state when free structure 204 has a horizontal magnetization direction and pinned structure 210 has a vertical magnetization direction.

In the example of FIG. 2B, processing circuitry 216 may detect a resulting voltage (e.g., a sense voltage) across switching element 214 that is small (e.g., less than a threshold) compared to when MTJ element 224 has been burned-in. For example, processing circuitry 216 may read a state of MTJ element 124 using a magneto-resistance of MTJ element 224. Moreover, processing circuitry 216 may detect a resulting voltage (e.g., a sense voltage) across switching element 214 that is greater than a voltage at MTJ element 224 when MTJ element 224 is set in the anti-parallel orientation state. In this way, processing circuitry 216 may read a state of MTJ element 224 and a magnetization direction using a resistance of MTJ element 224.

Figure 2C:
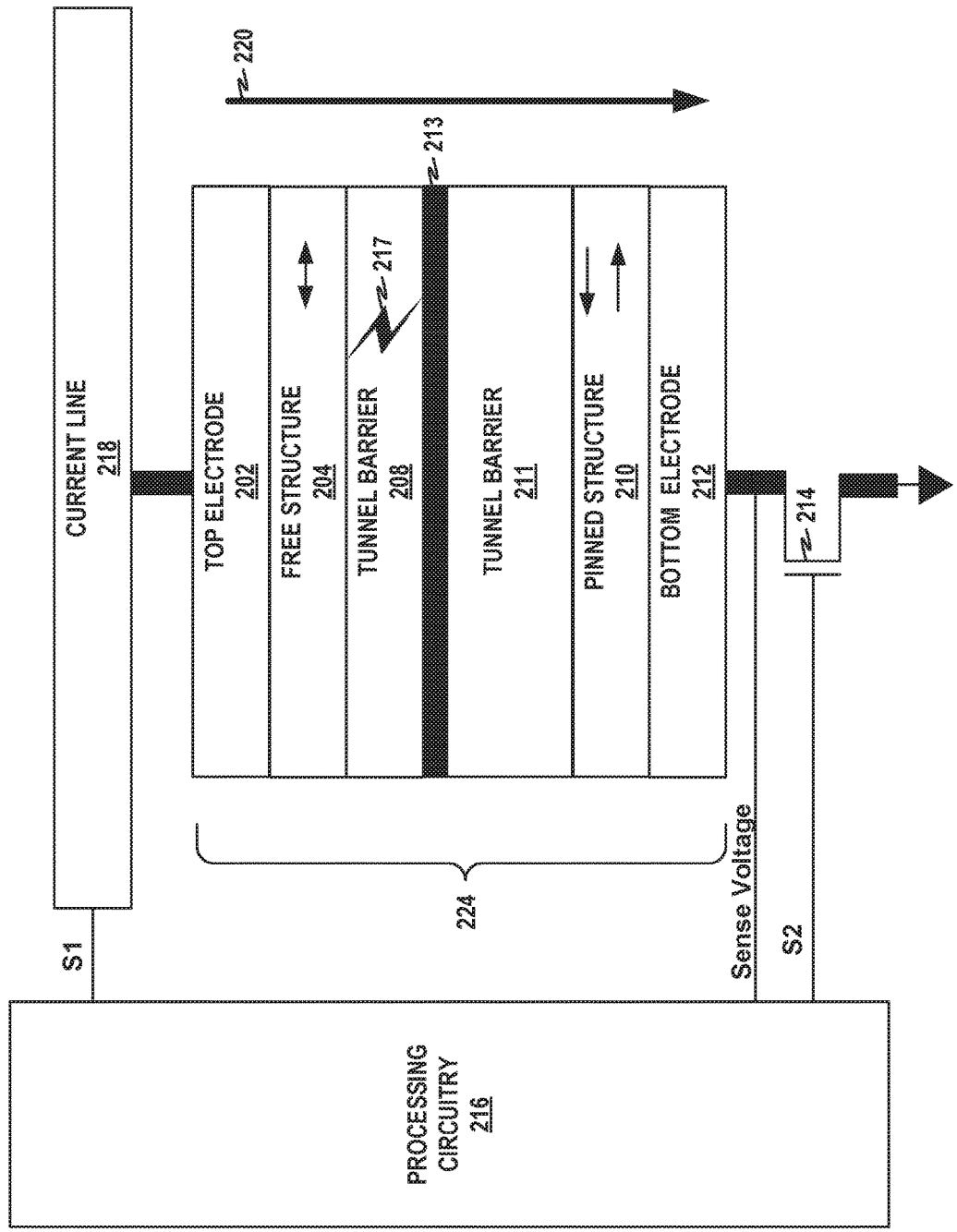
FIG. 2C shows a conceptual illustration of the second MTJ based programmable ROM device of FIG. 2A during a second state.

FIG. 2C shows a conceptual illustration of the second MTJ based programmable ROM device 200 of FIG. 2A during a second state. In the example of FIG. 2C, processing circuitry 216 may write to MTJ element 224 using an electrical current 220 to burn-in tunnel barrier 208. For example, processing circuitry 216 may apply a voltage at current line 218, which results in electrical current 220, that causes a dielectric structure of tunnel barrier 208 to breakdown, which may cause tunnel barrier 208 to function as a metal layer instead of a tunnel barrier. For instance, providing a write voltage (e.g., electrical current 220) to MTJ element 224 may generate low-resistance channel 217 that electrically connects free structure 204 and metal layer 213. Low-resistance channel 217 may result in tunnel barrier 208 having a lower resistance after applying electrical current 220 compared to a resistance of tunnel barrier 208 before applying electrical current 220.

In the example of FIG. 2C, electrical current 220 does not generate a low-resistance channel through tunnel barrier 211. For example, to provide a voltage, processing circuitry 216 is configured to provide the write voltage such that the write voltage breaks down tunnel barrier 208 and does not break down tunnel barrier 211. For instance, a magnitude of voltage applied by processing circuitry 216, via current line 218, may result in an electrical voltage across tunnel barrier 211 that is greater than a breakdown voltage of tunnel barrier 208 and less than a breakdown voltage of tunnel barrier 211.

When tunnel barrier 208 has been burned-in, processing circuitry 216 may detect a resulting voltage (e.g., a sense voltage) across switching element 214 that is large (e.g., greater than a threshold) compared to when tunnel barrier 208 has not been burned-in. In contrast, when MTJ element 224 has not been burned-in (see FIGS. 2A, 2B), processing circuitry 216 may detect a resulting voltage (e.g., a sense voltage) across switching element 214 that is small (e.g., less than a threshold) compared to when tunnel barrier 208 has been burned-in. In this way, processing circuitry 216 may determine whether a state of MTJ element 224 corresponds to a first state where tunnel barrier 208 and tunnel barrier 211 have not been burned-in, a second state where tunnel barrier 208 has been burned-in, and a third state where tunnel barrier 211 has been burned-in.

Figure 2D:
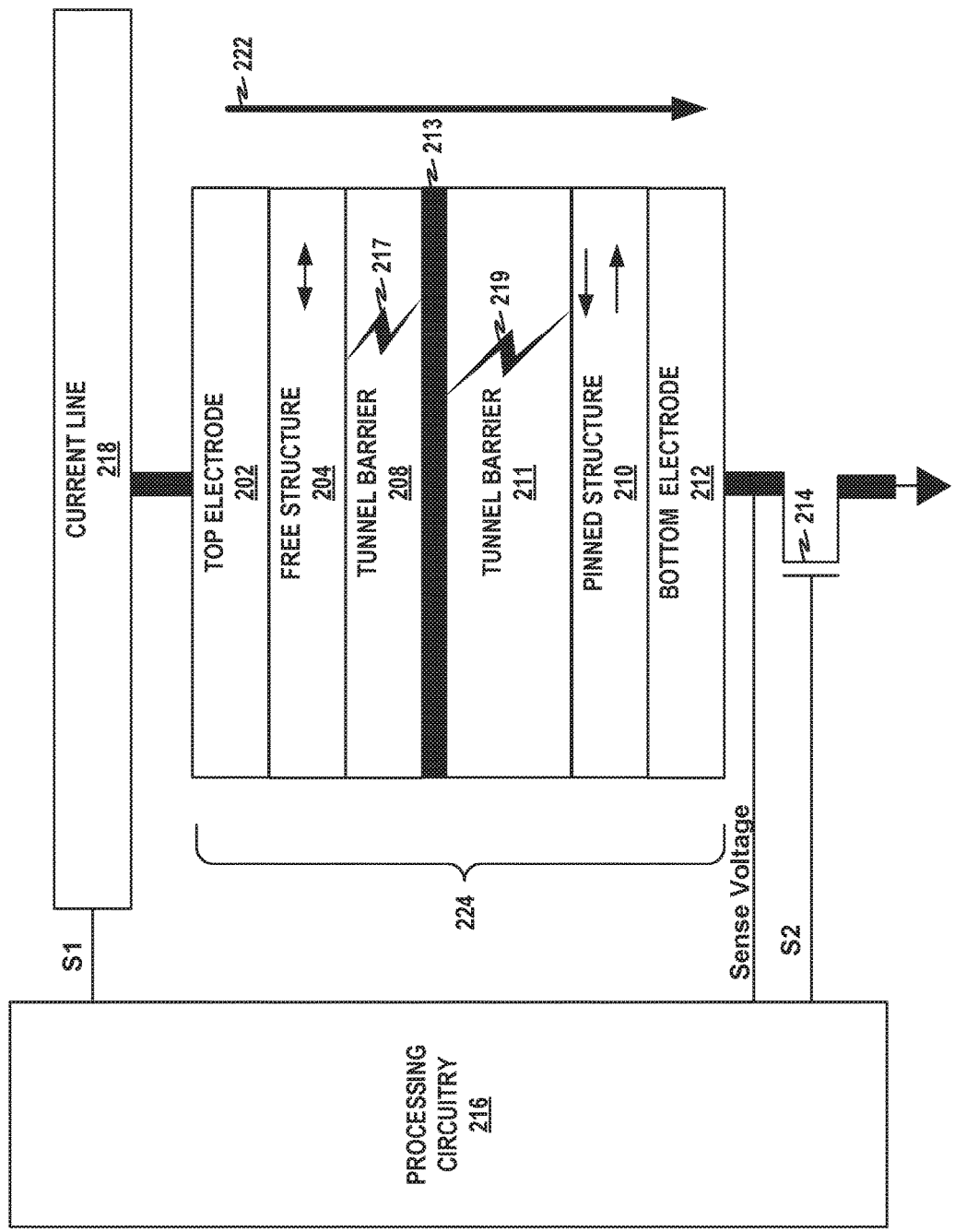
FIG. 2D shows a conceptual illustration of the second MTJ based programmable ROM device of FIG. 2A during a third state.

FIG. 2D shows a conceptual illustration of the second MTJ based programmable ROM device 200 of FIG. 2A during a third state. In the example of FIG. 2D, processing circuitry 216 may write to MTJ element 224 by using an electrical current 222 to burn-in tunnel barrier 208 and tunnel barrier 211.

For example, processing circuitry 216 may apply a voltage at current line 218, which results in electrical current 222, that causes a dielectric structure of tunnel barrier 208 and a dielectric structure of tunnel barrier 211 to breakdown, which may cause tunnel barrier 208 and tunnel barrier 211 to function as a metal layers instead of tunnel barriers. For example, processing circuitry 216 may be configured to provide the write voltage such that tunnel barrier 211 breaks down to generate low-resistance channel 219 between free structure 204 and pinned structure 210. In some examples, low-resistance channel 217, metal layer 213, and low-resistance channel 219 electrically connect free structure 204 and pinned structure 210.

Low-resistance channel 217 may result in tunnel barrier 208 having a lower resistance after applying electrical current 222 compared to a resistance of tunnel barrier 208 before applying electrical current 222. Similarly, low-resistance channel 219 may result in tunnel barrier 211 having a lower resistance after applying electrical current 222 compared to a resistance of tunnel barrier 211 before applying electrical current 222. In the example of FIG. 2D, processing circuitry 216 may burn-in tunnel barrier 208 and tunnel barrier 211 such that a magnetic field of pinned structure 210 sets the magnetic field of free structure 204.

For example, in response to providing a write voltage (e.g., electrical current 120) to MTJ element 124, low-resistance channel 217 and low-resistance channel 219 may cause pinned structure 210 to set a magnetic field of free structure 204 to a horizontal magnetic direction or vertical magnetic field of pinned structure 210. For example, low-resistance channel 217 and low-resistance channel 219 may cause pinned structure 210 to set a magnetic field of free structure 204 to a horizontal magnetic direction when pinned structure 210 comprises a horizontal magnetic direction. In some examples, low-resistance channel 217 and low-resistance channel 219 may cause pinned structure 210 to set a magnetic field of free structure 204 to a vertical magnetic direction.

When tunnel barrier 208 and tunnel barrier 211 have been burned-in, processing circuitry 216 may detect a resulting voltage (e.g., a sense voltage) across switching element 214 that is large (e.g., greater than a threshold) compared to when tunnel barrier 208 and tunnel barrier 211 have not been burned-in and compared to when only tunnel barrier 208 has been burned-in. In contrast, when MTJ element 224 has not been burned-in (see FIGS. 2A, 2B), processing circuitry 216 may detect a resulting voltage (e.g., a sense voltage) across switching element 214 that is small (e.g., less than a threshold) compared to when tunnel barrier 208 and tunnel barrier 211 have been burned-in.

For example, processing circuitry 216 may determine that MTJ element 224 is in a first state in response to detecting a resulting voltage (e.g., a sense voltage) across switching element 214 that is less than a first read threshold and less than a second read voltage threshold. In this example, processing circuitry 216 may determine that MTJ element 224 is in a second state in response to detecting a resulting voltage (e.g., a sense voltage) across switching element 214 that is less than the first read threshold and greater than the second read voltage threshold. In this example, processing circuitry 216 may determine that MTJ element 224 is in a third state in response to detecting a resulting voltage (e.g., a sense voltage) across switching element 214 that is greater than the first read threshold and greater than the second read voltage threshold.

Figure 3:
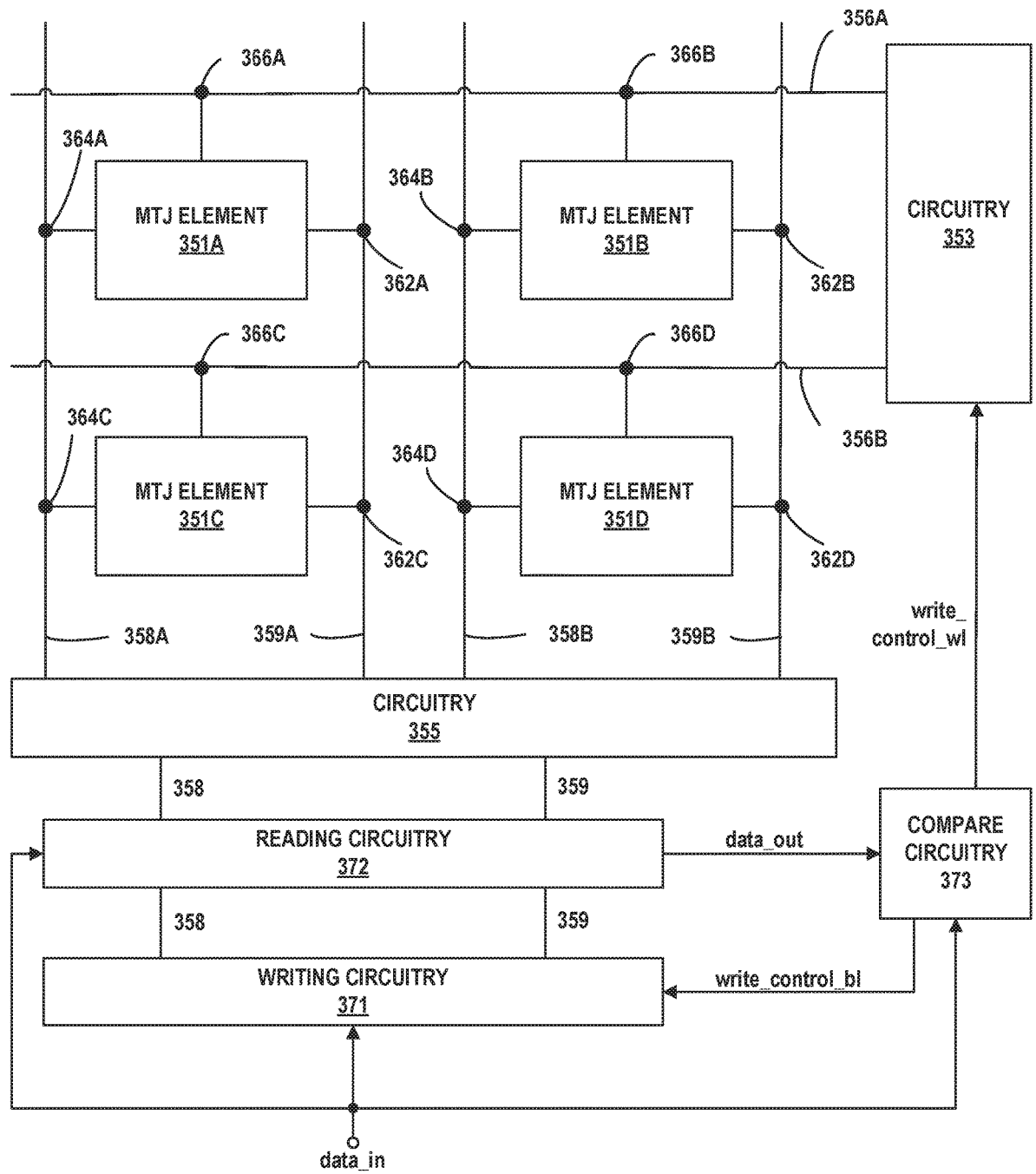
FIG. 3 shows a diagram of an array of MTJ elements that may be used to implement the techniques of the present disclosure.

FIG. 3 shows a diagram of an array of MTJ elements 351A, 351B, 351C, and 351D (collectively, MTJ elements 351) that may be used to implement the techniques of the present disclosure. MTJ element 124 and/or MTJ element 224 may be examples of MTJ elements 351. Memory devices implementing one or more of the techniques described in this disclosure may be implemented in a wide array of electronic devices ranging from small portable devices such as music players, smart phones, game cartridges, and memory sticks up to larger devices such as tablet computers, gaming devices or consoles, desktop computers, super computers, and enterprise storage solutions. Processing circuitry (e.g., processing circuitry 116, processing circuitry 216, etc.) described in FIGS. 1A-1D and 2A-2D, may include circuitry 355, reading circuitry 372, writing circuitry 371, compare circuitry 373, and circuitry 353.

Bitline 358A connects to MTJ element 351A at node 364A and connects to MTJ element 351C at node 364C. Bitline 358B connects to MTJ element 351B at node 364B and connects to MTJ element 351D at node 364D. Although, not explicitly shown in FIG. 3, each of nodes 364A-364D may correspond to a source or drain terminal of an access MOSFET for current through a respective MTJ element.

Bitline 359A connects to MTJ element 351A at node 362A and connects to MTJ element 351C at node 362C. Bitline 359B connects to MTJ element 351B at node 362B and connects to MTJ element 351D at node 362D. Although, not explicitly shown in FIG. 3, each of nodes 362A-362D may correspond to a source or drain terminal of an access MOSFET (e.g., switching element 114 of FIGS. 1A-1D, switching element 214 of FIGS. 2A-2D, etc.) for current through a respective MTJ element. For example, node 364A may correspond to a source or drain terminal of an access MOSFET for S1 and node 362A may correspond to a source or drain terminal of an access MOSFET for S2.

By controlling the voltages applied to wordline 356A, wordline 356B, bitline 358A, bitline 358B, bitline 359A, and bitline 359B, an individual MTJ element can be addressed. For example, suppose that a write operation is being performed on MTJ element 351A. Circuitry 353 may apply an access MOSFET turn-on voltage to wordline 356A and a turn-off voltage to wordline 356B, and circuitry 355 may pass a high voltage to bitline 359A but not to bitline 359B. In this case, the turn-on voltage applied to wordline 356A causes node 366A (connected to a gate of an access MOSFET, not shown in FIG. 3) to receive a turn-on voltage. The high voltage applied to bitline 359A causes node 362A (connected to a source or drain of an access MOSFET, not shown in FIG. 3) to receive a high voltage, and a source voltage applied to bitline 358A causes node 364A (connected to a source or drain of an access MOSFET) to receive a source voltage. As described above, the high voltage applied to node 366A causes current to flow through an access MOSFET. Thus, writing circuitry 371 may write MTJ element 351A. For example, writing circuitry 371 may generate an electrical current to burn-in tunnel barrier 108 of FIG. 1A. In some examples, writing circuitry 371 may generate an electrical current to burn-in tunnel barrier 208 and tunnel barrier 211 of FIG. 2A.

While this write operation is occurring at MTJ elements 351A 351B, 351C, and 351D may remain unchanged. Although the high voltage applied to wordline 356A can cause a high voltage at node 366B (connected to a gate of an access MOSFET for MTJ element 351B), circuitry 355 may not apply a high voltage to either bitline 358B or bitline 359B. In this case, with no high voltage drop across an access MOSFET for MTJ element 351B, the state of MTJ element 351B does not change.

Similarly, while this write operation is occurring at MTJ element 351A, the high voltage applied to bitline 359A causes a high voltage at node 362C, and the source voltage applied to bitline 358A causes a source voltage at node 364C. Circuitry 353, however, applies a turn-off voltage to wordline 356B. Thus, the access MOSFET of MTJ element 351C does not conduct current, and thus prevents current at MTJ element 351C. Without a current flow, the resistance of MTJ element 351C does not change, and the state of MTJ element 351C does not change. Accordingly, by controlling the voltages applied to wordline 356A, wordline 356B, bitline 358A, bitline 358B, bitline 359A, and bitline 359B, in the manner described above, MTJ elements 351A, 351B, 351C, and 351D can be individually written to without altering the state of MTJ elements that are connected to a common wordline or common bitline.

Writing circuitry 371 receives data input that represents multiple states. In some examples, writing circuitry 371 receives data input that represents two states (e.g., '0' or '1'). In some examples, writing circuitry 371 receives data input that represents more than two states (e.g., '00', '01', '10'). Depending on the data state to be written, writing circuitry 371 defines the appropriate voltage to be applied to the bitlines. For example, writing circuitry 371 defines the appropriate voltage to breakdown tunnel barrier 108 of FIG. 1A. In some examples, writing circuitry 371 defines the appropriate voltage to breakdown tunnel barrier 208 and/or tunnel barrier 211 of FIG. 2A. As discussed above, circuitry 355 controls the passing of the voltages from writing circuitry 371 output bitline 358 and bitline 359 to the various bitlines so that the write operation is applied to the correct MTJ element within the array of MTJ elements.

Reading circuitry 372 is configured to monitor the resistance and/or magnetoresistance of a given MTJ element, which may correspond to a spin-dependent diffusion, spin-orbit coupling, and spin-torque transfer of the given MTJ element, while the given MTJ element is undergoing a write operation. This monitoring of the resistance and/or magnetoresistance is termed Rmonitor, which represents the real time measuring of the MTJ element resistance and/or magnetoresistance during the write operation. Reading circuitry 372 may use the write states defined on data_in to determine which monitoring state and Rwrite_ref to set up.

Compare circuitry 373 compares the data state of the selected MTJ element of MTJ elements 351A-351D, as determined by reading circuitry 372 and defined on node data_out, to the data state as defined on node data in and issues a write terminate instruction on the write_control_bl and write_control_wl lines upon determining that the data states on data_in and data_out match.

When circuitry 373 issues a write terminate command on write_control_bl to writing circuitry 371, writing circuitry 371 terminates the application of the high voltage on bitline 358 or bitline 359 which causes the high voltage across the selected MTJ element to collapse and, thus, stop the resistance and/or magnetoresistance changing and stop modifying spin-dependent diffusion, spin-orbit coupling, and spin-torque transfer of the MTJ element. When circuitry 373 issues a write terminate command on write_control_wl to circuitry 353, circuitry 353 changes the turned-on wordline to turned-off which causes the current through the selected MTJ element to collapse and, thus, stop the resistance and/or magnetoresistance changing in the MTJ element.

In accordance with one or more techniques described herein, writing circuitry 371 is configured to receive an instruction to set an MTJ element to a low-resistance state. For example, writing circuitry 371 may be configured to receive an instruction to set MTJ element 351A to a state '0'. In response to receiving the instruction, writing circuitry 371 may be configured to provide a write voltage to the MTJ element such that the tunnel barrier breaks down to generate a low-resistance channel electrically connecting the free structure and the pinned structure. For example, writing circuitry 371 may be configured to define the appropriate voltage to be applied to the bitlines. In this example, circuitry 355 controls the passing of voltages from writing circuitry 371 output bitline 358 and bitline 359 to the various bitlines such that the write operation is applied to the correct MTJ element within the array of MTJ elements. For instance, writing circuitry 371 generates the write voltage at MTJ element 351 to set MTJ element 351 to a state '1'.

Figure 4:
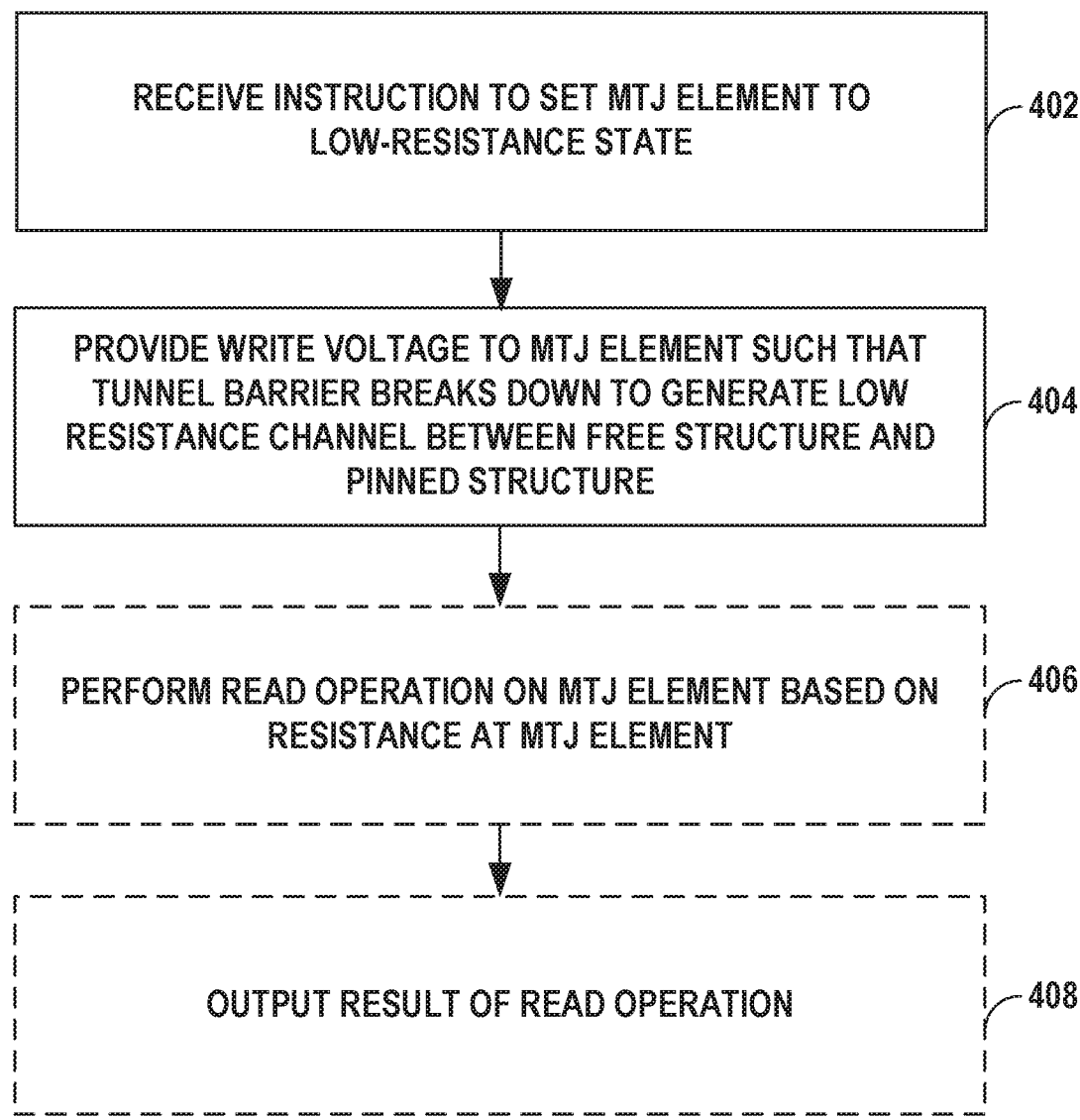
FIG. 4 shows a flowchart of a process for performing a write operation using an MTJ based programmable ROM device in accordance with the techniques of this disclosure.

FIG. 4 shows a flowchart of a process for performing a write operation using an MTJ based programmable ROM device in accordance with the techniques of this disclosure. Writing circuitry 371 is configured to receive an instruction to set an MTJ element to a low-resistance state (402). For example, writing circuitry 371 may be configured to receive an instruction to set MTJ element 351A to a state '0' or '1'. In some examples, writing circuitry 371 may be configured to receive an instruction to set MTJ element 351A to a state '00', '01', or '10'.

In response to receiving the instruction, writing circuitry 371 may be configured to provide a write voltage to the MTJ element such that the tunnel barrier breaks down to generate a low-resistance channel electrically connecting the free structure and the pinned structure (404). For example, writing circuitry 371 may be configured to provide a write voltage to MTJ element 124 of FIG. 1A such that tunnel barrier 108 breaks down to generate a low-resistance channel between free structure 104 and the pinned structure 110 of FIG. 1A. In some examples, writing circuitry 371 may be configured to provide a write voltage to MTJ element 224 of FIG. 2A such that tunnel barrier 208 breaks down to generate a low-resistance channel electrically between free structure 204 and the pinned structure 210 of FIG. 2A. In some examples, writing circuitry 371 may be configured to provide a write voltage to MTJ element 224 of FIG. 2A such that tunnel barrier 208 breaks down to generate a first low-resistance channel between free structure 204 and the pinned structure 210 and tunnel barrier 211 breaks down to generate a second low-resistance channel between free structure 204 and the pinned structure 210.

Reading circuitry 372 may optionally perform a read operation on the MTJ element based on a resistance at the MTJ element (406). For example, reading circuitry 372 may apply a small voltage (e.g., a read voltage) across the series combination of MTJ element 124 and switching element 114. Reading circuitry 372 may determine that MTJ element 124 stores a logical '1' value in response the voltage across switching element 114 being higher than a read threshold and may determine that MTJ element 124 stores a logical '0' value in response the voltage across switching element 114 being less than the read threshold. In some examples, reading circuitry 372 may determine that MTJ element 224 stores a logical '10' value in response the voltage across switching element 214 being higher than a read threshold, determine that MTJ element 224 stores a logical '01' value in response the voltage across switching element 214 being less than the first read threshold and greater than a second read voltage threshold, and determine that MTJ element 224 stores a logical '00' value in response the voltage across switching element 214 being less than the first read threshold and less than the second read voltage threshold.

Reading circuitry 372 may optionally output a result of the read operation (408). For example, reading circuitry 372 may output a logical '0' value in response to determining MTJ element 124 stores a logical '0' and output a logical '1' value in response to determining MTJ element 124 stores a logical '1'. In some examples, reading circuitry 372 may output a logical '00' value in response to determining MTJ element 224 stores a logical '00', output a logical '01' value in response to determining MTJ element 224 stores a logical '01', output a logical '11' value in response to determining MTJ element 224 stores a logical '11'.

Figure 5:
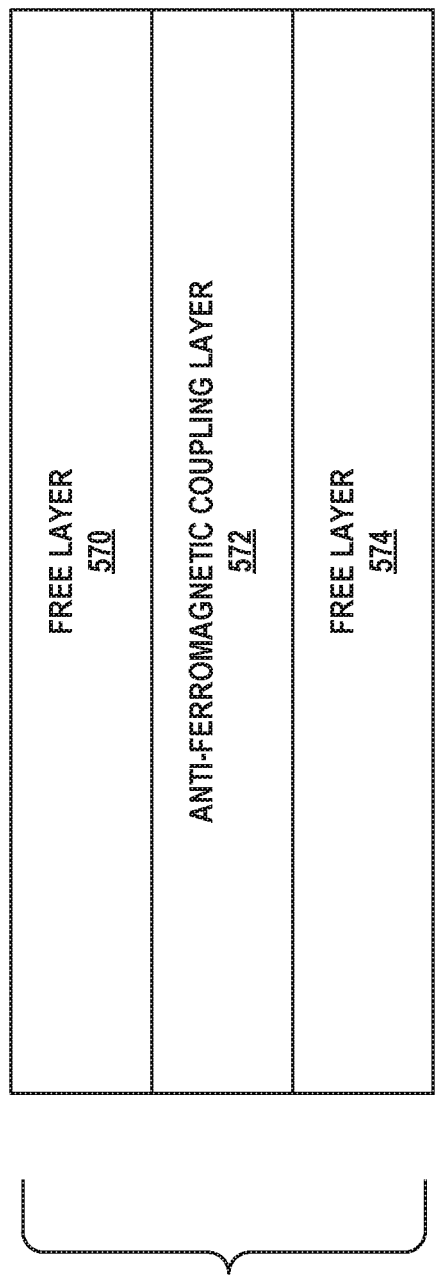
FIG. 5 shows a conceptual illustration of a first free structure that may be used to implement the techniques of the present disclosure.

FIG. 5 shows a conceptual illustration of a first free structure 504 that may be used to implement the techniques of the present disclosure. Free structure 504 may be an example of a free structure described above with respect to any combination of FIGS. 1A-1D, 2A-2D, 3, and 4. As shown, free structure 504 may include free layer 570, anti-ferromagnetic coupling layer 572, and free layer 574. Free layer 570 may include a magnetization direction that is free to switch between a parallel orientation and an antiparallel orientation. Similarly, free layer 574 may include a magnetization direction that is free to switch between a parallel orientation and an antiparallel orientation.

In the example of FIG. 5, free structure 504 includes anti-ferromagnetic coupling layer 572, which is arranged between free layer 570 and free layer 574. Anti-ferromagnetic coupling layer 572 may be configured to stabilize a magnetic state of free layer 570 and/or free layer 574. Anti-ferromagnetic coupling layer 572 may be formed of, for example, Ruthenium (Ru). Although the example of FIG. 5 illustrates a free structure with two free layers, in some examples, a free structure may include one free layer (e.g., without anti-ferromagnetic coupling layer 582) or more than two free layers (e.g., each pair of free layers spaced apart by a respective anti-ferromagnetic coupling layer).

Figure 6:
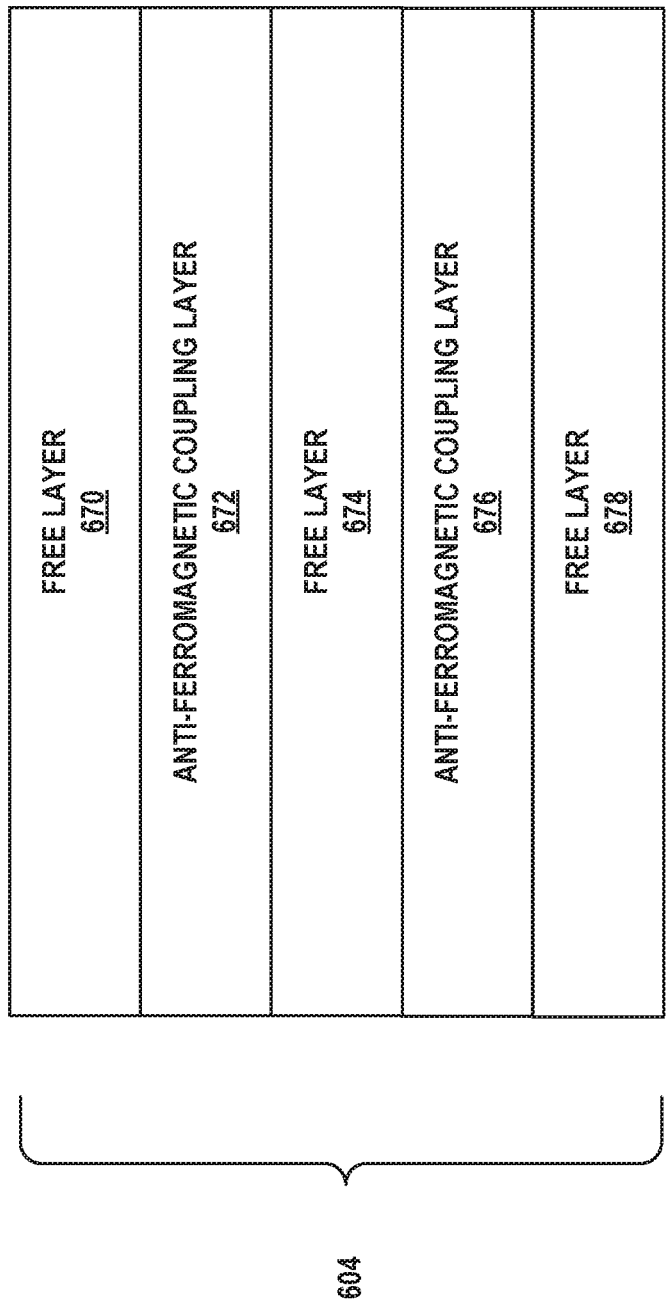
FIG. 6 shows a conceptual illustration of a second free structure that may be used to implement the techniques of the present disclosure.

FIG. 6 shows a conceptual illustration of a second free structure that may be used to implement the techniques of the present disclosure. Free structure 604 may be an example of a free structure described above with respect to any combination of FIGS. 1A-1D, 2A-2D, 3, and 4. As shown, free structure 604 may include free layer 670, anti-ferromagnetic coupling layer 672, free layer 674, anti-ferromagnetic coupling layer 676, and free layer 678. Free layers 670, 674, and 678 may each include a magnetization direction that is free to switch between a parallel orientation and an antiparallel orientation.

In the example of FIG. 6, free structure 604 includes anti-ferromagnetic coupling layer 672, which is arranged between free layer 670 and free layer 674. and anti-ferromagnetic coupling layer 678, which is arranged between free layer 674 and free layer 678. Anti-ferromagnetic coupling layers 672 and 678 may be configured to stabilize a magnetic state of one or more of free layers 670, 674, and 678. Anti-ferromagnetic coupling layer 672 and/or anti-ferromagnetic coupling layer 678 may be formed of, for example, Ruthenium (Ru). Although the example of FIG. 6 illustrates a free structure with three free layers, in some examples, a free structure may include more than three free layers.

Figure 7:
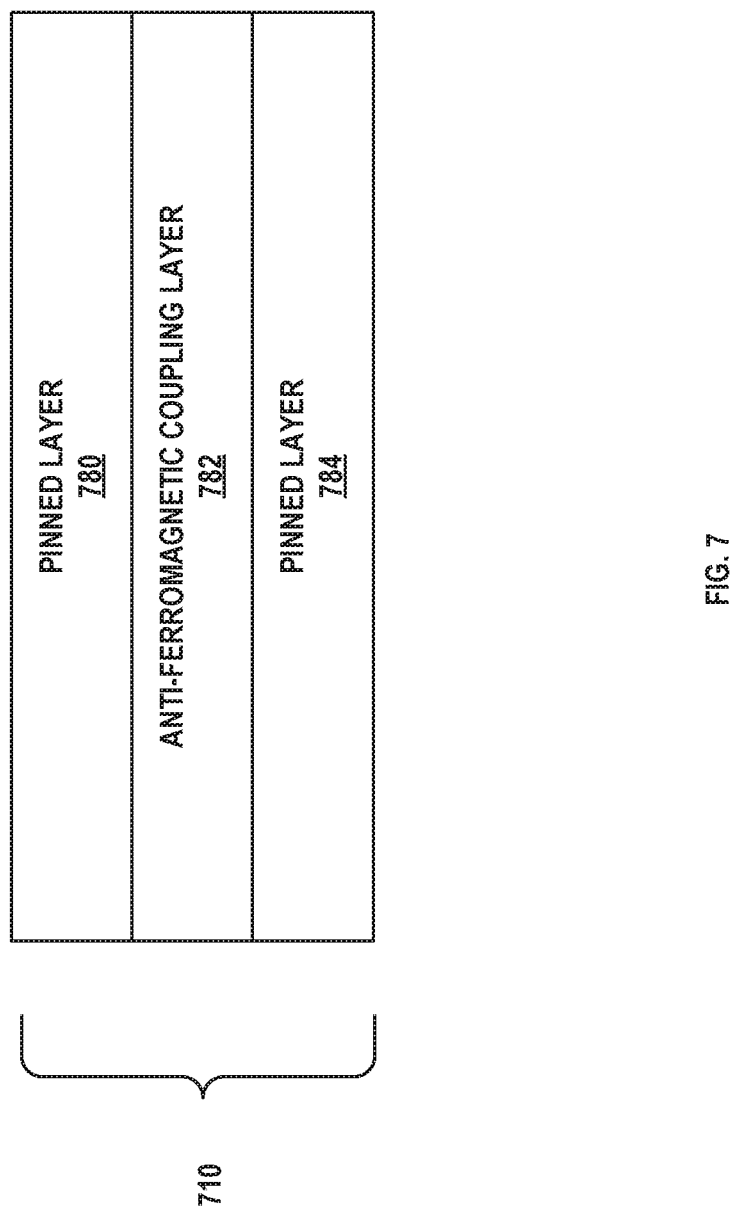
FIG. 7 shows a conceptual illustration of a first pinned structure that may be used to implement the techniques of the present disclosure.

FIG. 7 shows a conceptual illustration of a first pinned structure that may be used to implement the techniques of the present disclosure. Pinned structure 710 may be an example of a pinned structure described above with respect to any combination of FIGS. 1A-1D, 2A-2D, 3, and 4. As shown, pinned structure 710 may include pinned layer 780, anti-ferromagnetic coupling layer 782, and pinned layer 784. Pinned layer 780 may include a magnetization direction that is fixed or "pinned" to a single orientation. For example, pinned layer 780 may be pinned in a parallel orientation. In other examples, pinned layer 780 may be pinned in an antiparallel orientation. Similarly, pinned layer 784 may include a magnetization direction that is fixed or "pinned" to a single orientation.

In the example of FIG. 7, pinned structure 710 includes anti-ferromagnetic coupling layer 782, which is arranged between pinned layer 780 and pinned layer 784. Anti-ferromagnetic coupling layer 782 may be configured to stabilize a magnetic state of pinned layer 780 and/or pinned layer 784. Anti-ferromagnetic coupling layer 782 may be formed of, for example, Ruthenium (Ru). Although the example of FIG. 7 illustrates a pinned structure with two pinned layers, in some examples, a pinned structure may include one pinned layer (e.g., without anti-ferromagnetic coupling layer 782) or more than two pinned layers (e.g., each pair of pinned layers spaced apart by a respective anti-ferromagnetic coupling layer).

Figure 8:
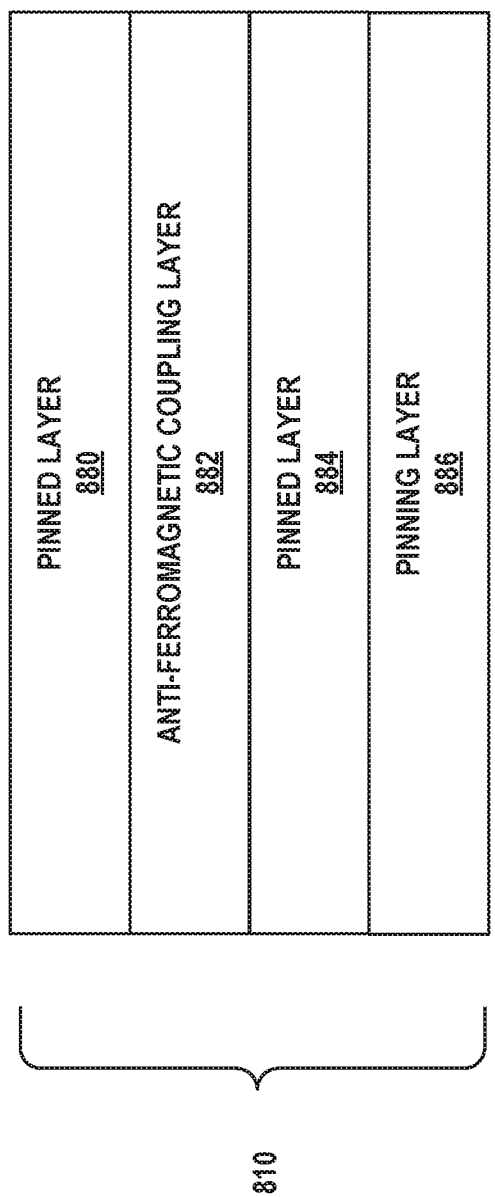
FIG. 8 shows a conceptual illustration of a second pinned structure that may be used to implement the techniques of the present disclosure.

FIG. 8 shows a conceptual illustration of a second pinned structure that may be used to implement the techniques of the present disclosure. Pinned structure 810 may be an example of a pinned structure described above with respect to any combination of FIGS. 1A-1D, 2A-2D, 3, and 4. As shown, pinned structure 810 may include pinned layer 880, anti-ferromagnetic coupling layer 882, pinned layer 884, and pinning layer 886. Pinned layer 880 may include a magnetization direction that is fixed or "pinned" to a single orientation. For example, pinned layer 880 may be pinned in a parallel orientation. In other examples, pinned layer 880 may be pinned in an antiparallel orientation. Similarly, pinned layer 884 may include a magnetization direction that is fixed or "pinned" to a single orientation. In some examples, pinning layer 886 may be arranged directly adjacent to a bottom electrode and pinned layer 880 may be arranged directly adjacent to a tunnel barrier.

In the example of FIG. 8, pinned structure 810 includes anti-ferromagnetic coupling layer 882, which is arranged between pinned layer 880 and pinned layer 884. Anti-ferromagnetic coupling layer 882 may be configured to stabilize a magnetic state of pinned layer 880 and/or pinned layer 884. Anti-ferromagnetic coupling layer 882 may be formed of, for example, Ruthenium (Ru). Although the example of FIG. 8 illustrates a pinned structure with two pinned layers, in some examples, a pinned structure may include one pinned layer or more than two pinned layers.

Pinning layer 886 may be configured to stabilize a magnetic state of pinned layer 880 and/or pinned layer 884. Pinning layer 886 may be formed of an anti-ferromagnetic material. For example, pinning layer 886 may be formed of, for example, but not limited to, platinum manganese (PtMn), Ferro Manganese (FeMn), iridium manganese (IrMn), or another material. In some examples, pinning layer 886 may be arranged directly adjacent to a bottom electrode and pinned layer 880 may be arranged directly adjacent to a tunnel barrier.

Figure 9:
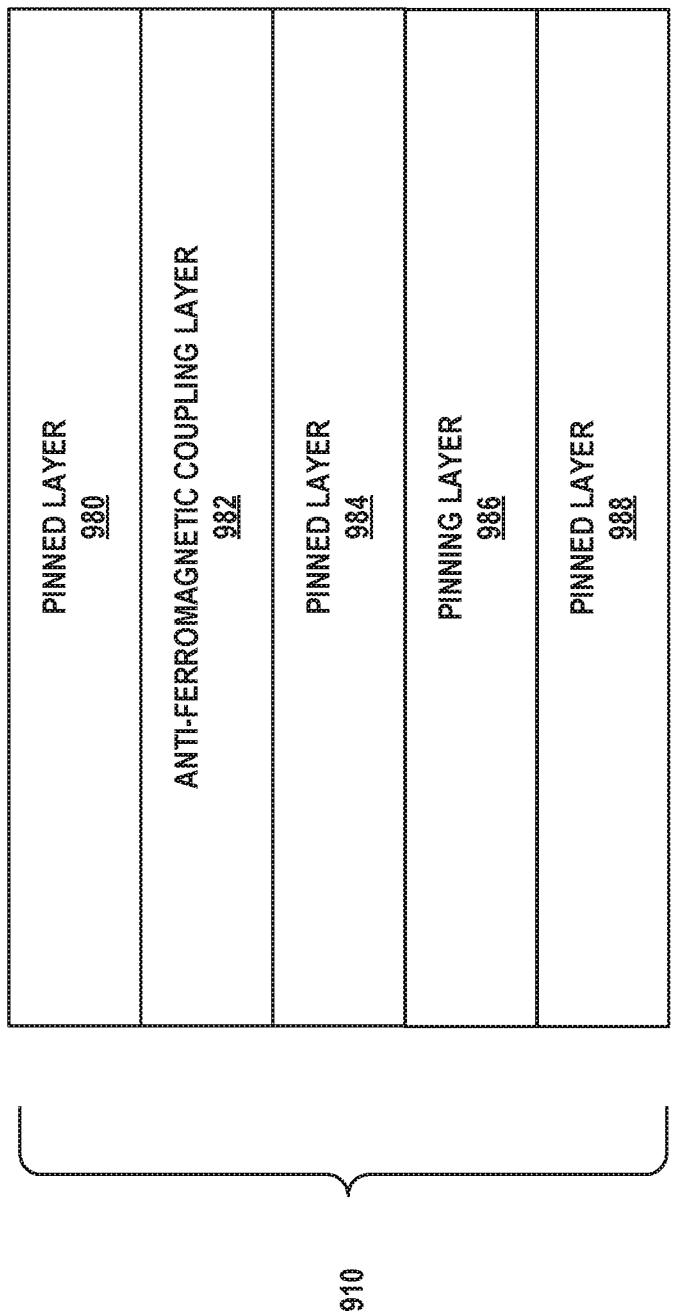
FIG. 9 shows a conceptual illustration of a third pinned structure that may be used to implement the techniques of the present disclosure.

FIG. 9 shows a conceptual illustration of a third pinned structure that may be used to implement the techniques of the present disclosure. Pinned structure 910 may be an example of a pinned structure described above with respect to any combination of FIGS. 1A-1D, 2A-2D, 3, and 4.

As shown, pinned structure 910 may include pinned layer 980, anti-ferromagnetic coupling layer 982, pinned layer 984, pinning layer 986, and pinned layer 988. Pinned layers 980, 984, and 988 may each include a magnetization direction that is fixed or "pinned" to a single orientation. The addition of pinned layer 988 may help to improve a stability of one or more of pinned layers 980, 984, and 988. Pinning layer 986 may be formed of an anti-ferromagnetic material. For example, pinning layer 986 may be formed of, for example, but not limited to, platinum manganese (PtMn), Ferro Manganese (FeMn), iridium manganese (IrMn), or another material. In some examples, pinned layer 988 may be arranged directly adjacent to a bottom electrode and pinned layer 980 may be arranged directly adjacent to a tunnel barrier.

In the example of FIG. 9, pinned structure 910 includes anti-ferromagnetic coupling layer 982, which is arranged between pinned layer 980 and pinned layer 984. Anti-ferromagnetic coupling layer 982 may be configured to stabilize a magnetic state of pinned layer 980 and/or pinned layer 984. Anti-ferromagnetic coupling layer 982 may be formed of, for example, Ruthenium (Ru). Although the example of FIG. 9 illustrates a pinned structure with two pinned layers, in some examples, a pinned structure may include one pinned layer or more than two pinned layers.

The term "circuitry" as used herein may refer to any of the foregoing structure or any other structure suitable for processing program code and/or data or otherwise implementing the techniques described herein. Circuitry may, for example, any of a variety of types of solid state circuit elements, such as CPUs, CPU cores, GPUs, DSPs, ASICs, mixed-signal integrated circuits, FPGAs, microcontrollers, programmable logic controllers (PLCs), programmable logic device (PLDs), complex PLDs (CPLDs), systems on a chip (SoC), any subsection of any of the above, an interconnected or distributed combination of any of the above, or any other integrated or discrete logic circuitry, or any other type of component or one or more components capable of being configured in accordance with any of the examples disclosed herein.

As used in this disclosure, circuitry may also include one or more memory devices, such as any volatile or non-volatile media, such as a RAM, ROM, non-volatile RAM (NVRAM), electrically erasable programmable ROM (EEPROM), flash memory, and the like. The one or more memory devices may store computer-readable instructions that, when executed or processed the circuitry, cause the circuitry to implement the techniques attributed herein to circuitry. The circuitry of this disclosure may be programmed, or otherwise controlled, with various forms of firmware and/or software.

Various illustrative aspects of the disclosure have been described above. These and other aspects are within the scope of the following claims.

The invention claimed is:

1. A device for performing a write operation, the device comprising:
   a Magnetic Tunnel Junction (MTJ) element, the MTJ element comprising a free structure, a pinned structure, and a tunnel barrier arranged between the free structure and the pinned structure; and
   processing circuitry configured to:
      receive an instruction to set the MTJ element to a low-resistance state; and
      provide a write voltage to the MTJ element such that the tunnel barrier breaks down to generate a low-resistance channel between the free structure and the pinned structure, wherein the low-resistance channel electrically connects the free structure and the pinned structure such that the MTJ element comprises a resistance of less than one-tenth of a resistance at the MTJ element before providing the write voltage to the MTJ element.

2. The device of claim 1, wherein the pinned structure comprises a horizontal magnetic field or vertical magnetic field and wherein the low-resistance channel causes the pinned structure to set the magnetic field of the free structure to the horizontal magnetic field or vertical magnetic field of the pinned structure.

3. The device of claim 1, wherein the processing circuitry is configured to:
   perform a read operation on the MTJ element based on a resistance at the MTJ element; and
   output a result of the read operation.

4. The device of claim 3, wherein, to perform the read operation, the processing circuitry is configured to:
   determine a state of the MTJ element is the low-resistance state in response to determining the resistance at the MTJ element is less than a threshold resistance; and
   determine the state of the MTJ element is not the low-resistance state in response to determining the resistance at the MTJ element is not less than a threshold resistance.

5. The device of claim 4, further comprising:
   a switching element, wherein the MTJ element and the switching element form a series string; and
   wherein the processing circuitry is configured to:
      apply a read voltage across the series string;
      detect a sense voltage across the switching element while applying the read voltage across the series string;
      determine the resistance at the MTJ element is less than the threshold resistance in response to the sense voltage being greater than a voltage threshold; and
      determine the resistance at the MTJ element is not less than the threshold resistance in response to the sense voltage being not being greater than the voltage threshold.

6. The device of claim 3, wherein, to perform the read operation, the processing circuitry is configured to:
  determine a state of the MTJ element is a parallel magnetization state in response to determining the resistance at the MTJ element is less than a threshold resistance; and
  determine the state of the MTJ element is an anti-parallel magnetization state in response to determining the resistance at the MTJ element is not less than the threshold resistance.

7. A device for performing a write operation, the device comprising:
  a Magnetic Tunnel Junction (MTJ) element, the MTJ element comprising a free structure, a pinned structure, and a tunnel barrier arranged between the free structure and the pinned structure; and
  processing circuitry configured to:
    receive an instruction to set the MTJ element to a low-resistance state;
    provide a write voltage to the MTJ element such that the tunnel barrier breaks down to generate a low-resistance channel between the free structure and the pinned structure;
  wherein the tunnel barrier is a first tunnel barrier;
  wherein the MTJ element comprises a metal layer and a second tunnel barrier,
  wherein the metal layer that spaces apart the first tunnel barrier and the second tunnel barrier;
  wherein the second tunnel barrier spaces apart the pinned structure and the free structure; and
  wherein the first tunnel barrier comprises a thickness less than a thickness of the second tunnel barrier.

8. The device of claim 7,
  wherein the first tunnel barrier spaces apart the free structure and the metal layer; and
  wherein the low-resistance channel electrically connects the free structure and the metal layer.

9. The device of claim 7,
  wherein the first tunnel barrier spaces apart the pinned structure and the metal layer; and
  wherein the low-resistance channel electrically connects the pinned structure and the metal layer.

10. The device of claim 7, wherein, to provide the write voltage, the processing circuitry is configured to provide the write voltage such that the write voltage breaks down the first tunnel barrier and does not break down the second tunnel barrier.

11. The device of claim 7,
  wherein the low-resistance channel is a first low-resistance channel and wherein, to provide the write voltage, the processing circuitry is configured to provide the write voltage such that the second tunnel barrier breaks down to generate a second low-resistance channel between the free structure and the pinned structure; and
  wherein the first low-resistance channel, the metal layer, and the second low-resistance channel electrically connect the free structure and the pinned structure.

12. The device of claim 11, wherein the pinned structure comprises a horizontal magnetic field or vertical magnetic field and wherein the first low-resistance channel, the metal layer, and the second low-resistance channel cause the pinned structure to set the magnetic field of the free structure to the horizontal magnetic field or vertical magnetic field of the pinned structure.

13. The device of claim 1, wherein the free structure comprises:
  a first free layer;
  an anti-ferromagnetic coupling layer; and
  a second free layer, wherein the anti-ferromagnetic coupling layer is arranged between the first free layer and the second free layer.

14. The device of claim 13, wherein the anti-ferromagnetic coupling layer is a first anti-ferromagnetic coupling layer and wherein the free structure further comprises:
  a third free layer; and
  a second anti-ferromagnetic coupling layer, wherein the second anti-ferromagnetic coupling layer is arranged between the second free layer and the third free layer.

15. The device of claim 1, wherein the free structure includes one free layer.

16. The device of claim 1, wherein the pinned structure comprises:
  a first pinned layer;
  an anti-ferromagnetic coupling layer; and
  a second pinned layer, wherein the anti-ferromagnetic coupling layer is arranged between the first pinned layer and the second pinned layer.

17. The device of claim 1, wherein the pinned structure includes one pinned layer.

18. A method for performing a write operation, the method comprising:
  receiving, by processing circuitry, an instruction to set the magnetic tunnel junction element to a low-resistance state, wherein the magnetic tunnel junction element includes a free structure, a pinned structure, and a tunnel barrier, the free structure being spaced apart from the pinned structure by the tunnel barrier; and
  providing, by the processing circuitry, a write voltage to the magnetic tunnel junction element such that the tunnel barrier breaks down to generate a low-resistance channel between the free structure and the pinned structure, wherein the low-resistance channel electrically connects the free structure and the pinned structure such that the magnetic tunnel junction element comprises a resistance of less than one-tenth of a resistance at the magnetic tunnel junction element before providing the write voltage to the magnetic tunnel junction element.

* * * * *